US008704234B2

(12) United States Patent
Kubota et al.

(10) Patent No.: US 8,704,234 B2
(45) Date of Patent: Apr. 22, 2014

(54) LIGHT-EMITTING DEVICE AND ELECTRONIC APPARATUS HAVING A POWER SOURCE LINE THAT OVERLAPS A CAPACITOR ELEMENT

(75) Inventors: Takehiko Kubota, Suwa (JP); Eiji Kanda, Suwa (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 1202 days.

(21) Appl. No.: 11/552,745

(22) Filed: Oct. 25, 2006

(65) Prior Publication Data

US 2007/0120118 A1 May 31, 2007

(30) Foreign Application Priority Data

Nov. 30, 2005 (JP) ................................. 2005-345298

(51) Int. Cl.
 *H01L 27/14* (2006.01)
 *H01L 29/04* (2006.01)
 *H01L 29/15* (2006.01)

(52) U.S. Cl.
 USPC ................... 257/72; 257/59; 257/79; 257/88; 257/E29.117

(58) Field of Classification Search
 USPC ................. 257/59, 72, E29.117; 345/76, 205
 See application file for complete search history.

(56) References Cited

U.S. PATENT DOCUMENTS

| | | | |
|---|---|---|---|
| 5,990,629 A * | 11/1999 | Yamada et al. | 315/169.3 |
| 6,072,450 A | 6/2000 | Yamada et al. | |
| 6,229,506 B1 | 5/2001 | Dawson et al. | |
| 6,274,887 B1 * | 8/2001 | Yamazaki et al. | 257/72 |
| 6,677,621 B2 | 1/2004 | Yamazaki et al. | |
| 6,689,492 B1 | 2/2004 | Yamazaki et al. | |
| 6,784,454 B2 * | 8/2004 | Anzai | 257/59 |
| 6,835,954 B2 | 12/2004 | Park et al. | |
| 6,876,345 B2 * | 4/2005 | Akimoto et al. | 345/76 |
| 6,882,105 B2 | 4/2005 | Murakami et al. | |
| 6,921,918 B2 | 7/2005 | Park et al. | |
| 7,052,930 B2 | 5/2006 | Park et al. | |
| 7,057,588 B2 | 6/2006 | Asano et al. | |
| 7,067,973 B2 | 6/2006 | Murakami et al. | |
| 7,094,624 B2 | 8/2006 | Park et al. | |

(Continued)

FOREIGN PATENT DOCUMENTS

| | | |
|---|---|---|
| CN | 1446029 A | 10/2003 |
| CN | 1457220 A | 11/2003 |

(Continued)

OTHER PUBLICATIONS

Mar. 24, 2011 Office Action issued in Chinese Patent Application No. 201010194687.9 (with translation).

(Continued)

*Primary Examiner* — S. V. Clark
*Assistant Examiner* — Jesse Y Miyoshi
(74) *Attorney, Agent, or Firm* — Oliff PLC

(57) ABSTRACT

A light-emitting device includes a drive transistor for controlling the quantity of current supplied to a light-emitting element, a capacitor element electrically connected to a gate electrode of the drive transistor, and an electrical continuity portion for electrically connecting the drive transistor and the light-emitting element, these elements being disposed on a substrate. The electrical continuity portion is disposed on the side opposite to the capacitor element with the drive transistor disposed therebetween.

22 Claims, 16 Drawing Sheets

(56) References Cited

U.S. PATENT DOCUMENTS

| | | | |
|---|---|---|---|
| 7,142,180 B2 | 11/2006 | Akimoto et al. | |
| 7,147,530 B2 | 12/2006 | Yamazaki et al. | |
| 7,211,949 B2 | 5/2007 | Murakami et al. | |
| 7,247,878 B2 | 7/2007 | Park et al. | |
| 7,277,072 B2 | 10/2007 | Akimoto et al. | |
| 7,420,211 B2 * | 9/2008 | Ohtani et al. | 257/72 |
| 7,477,218 B2 | 1/2009 | Koga et al. | |
| 7,483,001 B2 | 1/2009 | Matsueda | |
| 7,510,905 B2 | 3/2009 | Fujii et al. | |
| 7,550,306 B2 | 6/2009 | Park et al. | |
| 7,592,982 B2 | 9/2009 | Kwak | |
| 7,629,743 B2 | 12/2009 | Murakami et al. | |
| 7,655,499 B2 | 2/2010 | Fujii et al. | |
| 7,825,588 B2 | 11/2010 | Yamazaki et al. | |
| 7,855,387 B2 | 12/2010 | Kubota et al. | |
| 8,031,144 B2 | 10/2011 | Akimoto et al. | |
| 8,203,265 B2 | 6/2012 | Yamazaki et al. | |
| 8,207,024 B2 | 6/2012 | Yamazaki et al. | |
| 8,395,161 B2 | 3/2013 | Yamazaki et al. | |
| 2002/0196213 A1 | 12/2002 | Akimoto et al. | |
| 2003/0062845 A1 | 4/2003 | Yamazaki et al. | |
| 2003/0213955 A1 | 11/2003 | Noguchi | |
| 2004/0070808 A1 | 4/2004 | Nakanishi | |
| 2004/0173811 A1 | 9/2004 | Yamazaki et al. | |
| 2005/0057182 A1 | 3/2005 | Shibusawa | |
| 2005/0168142 A1 | 8/2005 | Murakami et al. | |
| 2005/0170643 A1 | 8/2005 | Fujii et al. | |
| 2005/0230752 A1 | 10/2005 | Kanno et al. | |
| 2005/0259142 A1 | 11/2005 | Kwak | |
| 2007/0069997 A1 | 3/2007 | Nakanishi | |
| 2007/0080360 A1 | 4/2007 | Mirsky et al. | |
| 2007/0120118 A1 | 5/2007 | Kubota et al. | |
| 2011/0031882 A1 | 2/2011 | Kubota et al. | |
| 2011/0279434 A1 | 11/2011 | Akimoto et al. | |
| 2012/0023149 A1 | 1/2012 | Kinsman et al. | |
| 2012/0026149 A1 | 2/2012 | Nakanishi | |
| 2012/0104401 A1 | 5/2012 | Kubota et al. | |
| 2013/0214276 A1 | 8/2013 | Kubota et al. | |

FOREIGN PATENT DOCUMENTS

| | | | |
|---|---|---|---|
| CN | 1649096 A | 8/2005 | |
| EP | 0 653 741 A1 | 5/1995 | |
| EP | 1 193 676 A2 | 4/2002 | |
| EP | 1 367 647 A2 | 12/2003 | |
| JP | A-2001-052873 | 2/2001 | |
| JP | A-2002-050484 | 2/2002 | |
| JP | A-2002-082651 | 3/2002 | |
| JP | A 2002-189447 | 7/2002 | |
| JP | A-2003-005709 | 1/2003 | |
| JP | A-2003-091245 | 3/2003 | |
| JP | A-2003-108036 | 4/2003 | |
| JP | A-2003-108068 | 4/2003 | |
| JP | A-2003-167533 | 6/2003 | |
| JP | A-2003-295793 | 10/2003 | |
| JP | A 2004-119219 | 4/2004 | |
| JP | A-2004-133240 | 4/2004 | |
| JP | A-2004-191627 | 7/2004 | |
| JP | A 2004-213004 | 7/2004 | |
| JP | A-2005-157262 | 6/2005 | |
| JP | A-2005-157264 | 6/2005 | |
| JP | A-2005-157266 | 6/2005 | |
| JP | A-2005-202254 | 7/2005 | |
| JP | A-2005-316384 | 11/2005 | |
| JP | A-2007-148216 | 6/2007 | |
| JP | A-2007-148217 | 6/2007 | |
| WO | WO 03/071511 | * 8/2003 | H01L 29/04 |
| WO | WO 2004/102517 A1 | 11/2004 | |

OTHER PUBLICATIONS

Dec. 13, 2011 Notification of Reasons for Refusal issued in Japanes Patent Application No. 2005-345300 (with translation).
Dec. 13, 2011 Decision of Dismissal of Amendment issued in Japanese Patent Applicaation No. 2005-345300 (with translation).
Dec. 13, 2011 Notification of Reasons for Refusal issued in Japanese Patent Application No. 2011-162943 (with translation).
May 31, 2011 Notification of Reasons for Refusal issued in Japanese Patent Application No. 2005-345300 (with translation).
Aug. 23, 2011 Notification of Reasons for Refusal issued in Japanes Patent Application No. 2005-345300 (with translation).
Jun. 8, 2010 Notification of Reasons for Refusal issued in Japanese Patent Application No. 2005-345299 (with translation).
Sep. 14, 2010 Decision of Refusal issued in Japanese Patent Application No. 2005-345299 (with translation).
Feb. 22, 2011 Notification of Reasons for Refusal issued in Japanese Patent Applcaition No. 2010-099622 (with translation).
Aug. 9, 2011 Decision of Refusal issued in Japanes Patent Application No. 2010-099622 (with translation).
Oct. 3, 2011 Non-Final Rejection issued in U.S. Appl. No. 12/911,344.
Aug. 22, 2012 Search Report issued in European Patent Application No. 06024614.7.
Aug. 20, 2012 Search Report issued in European Patent Application 10188186.0.
Japanese Office Action issued in Application No. JP 2010-099622 dated May 15, 2012 (w/ English Translation).
Aug. 13, 2013 Office Action issued in U.S. Appl. No. 13/347,260.
Aug. 23, 2011 Office Action issued in Japanese Patent Application No. 2005-345300 (with translation).
Oct. 11, 2013 Office Action issued in U.S. Appl. No. 13/556,685.
Mar. 20, 2013 Office Action issued in U.S. Appl. No. 13/347,260.
Sep. 14, 2012 Office Action issued in U.S. Appl. No. 13/347,260.
Nov. 7, 2013 Office Action issued in U.S. Appl. No. 13/846,262.
Jul. 26, 2010 Notice of Allowance issued in U.S. Appl. No. 11/548,802.
Nov. 25, 2009 Office Action issued in U.S. Appl. No. 11/548,802.
Oct. 10, 2013 Office Action issued in U.S. Appl. No. 12/911,344.
Sep. 19, 2013 Notice of Allowance issued in U.S. Appl. No. 12/911,344.
Apr. 20, 2012 Notice of Allowance issued in U.S. Appl. No. 12/911,344.
U.S. Appl. No. 13/347,260, filed Jan. 10, 2012 in the name of Kubota et al.
U.S. Appl. No. 13/846,262, filed Mar. 18, 2013 in the name of Kubota et al.
U.S. Appl. No. 11/548,802, filed Oct. 12, 2006 in the name of Kubota et al.
U.S. Appl. No. 12/911,344, filed Oct. 25, 2010 in the name of Kubota et al.
U.S. Appl. No. 13/556,685, filed Jul. 24, 2012 in the name of Kubota et al.
Dec. 17, 2013 Office Action in U.S. Appl. No. 13/347,260.

* cited by examiner

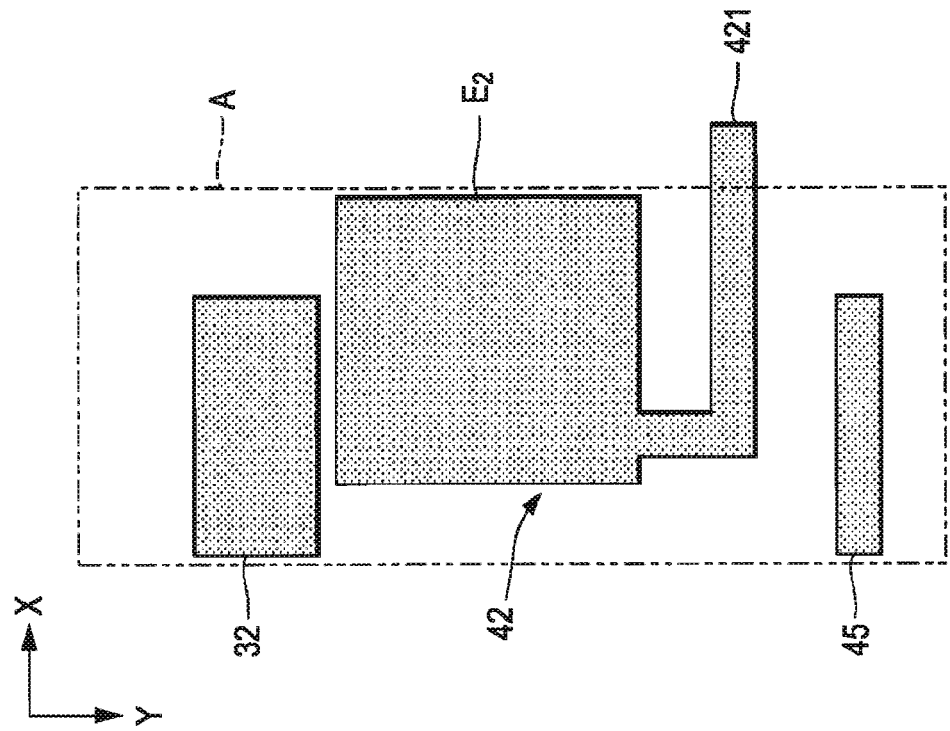
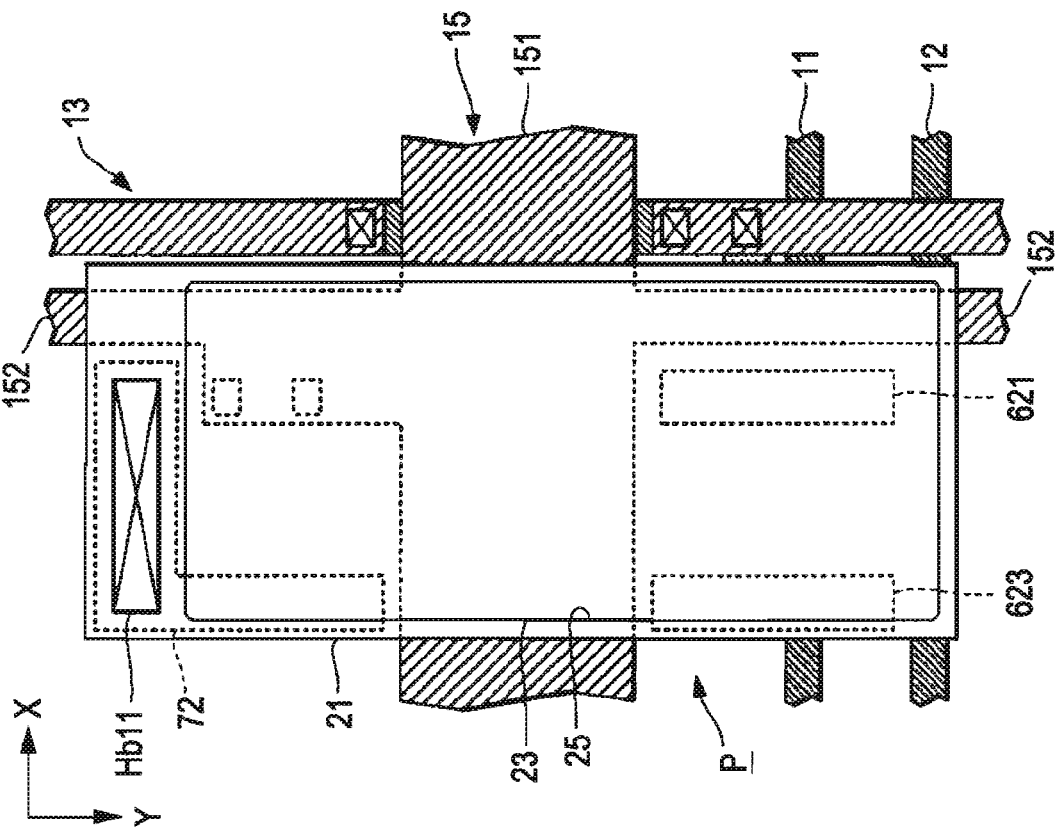

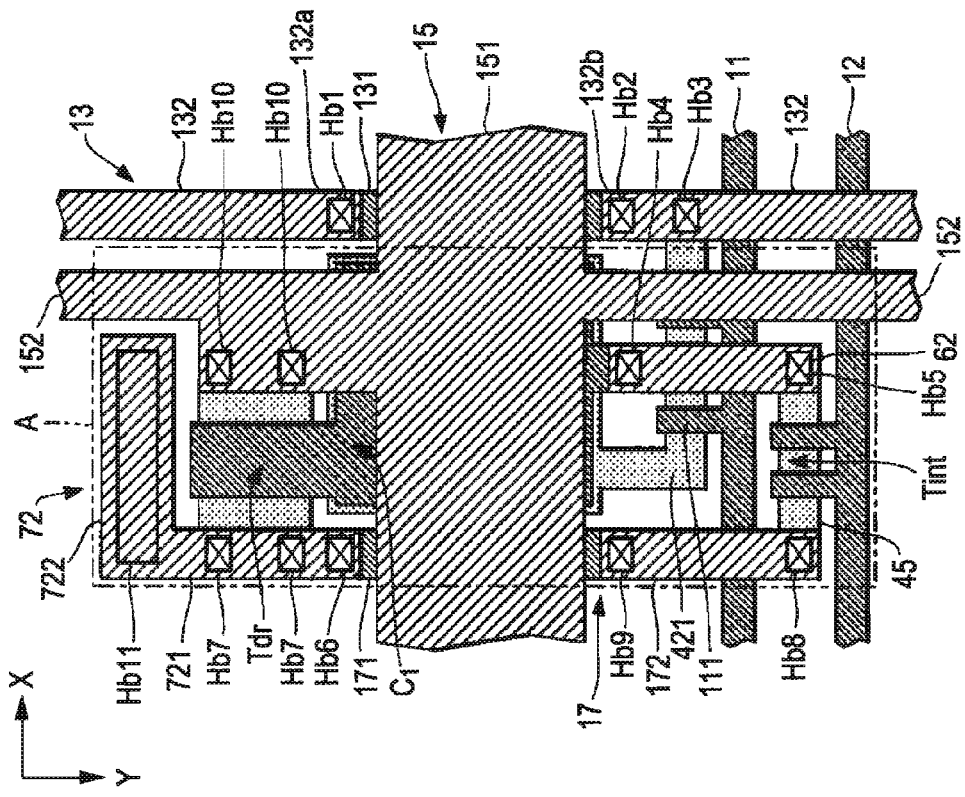
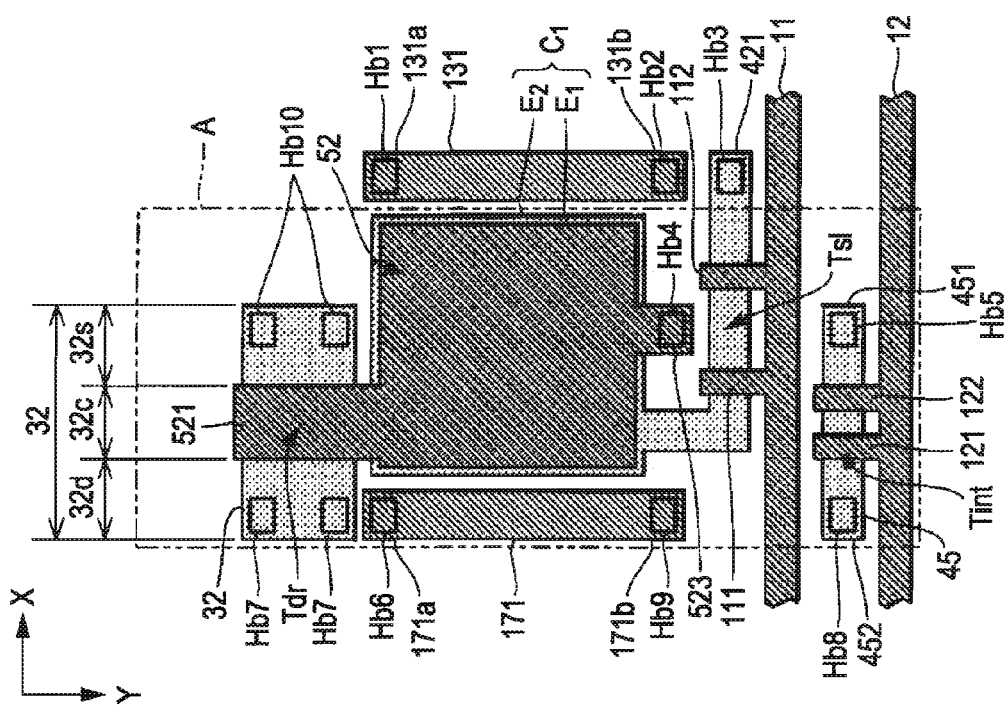

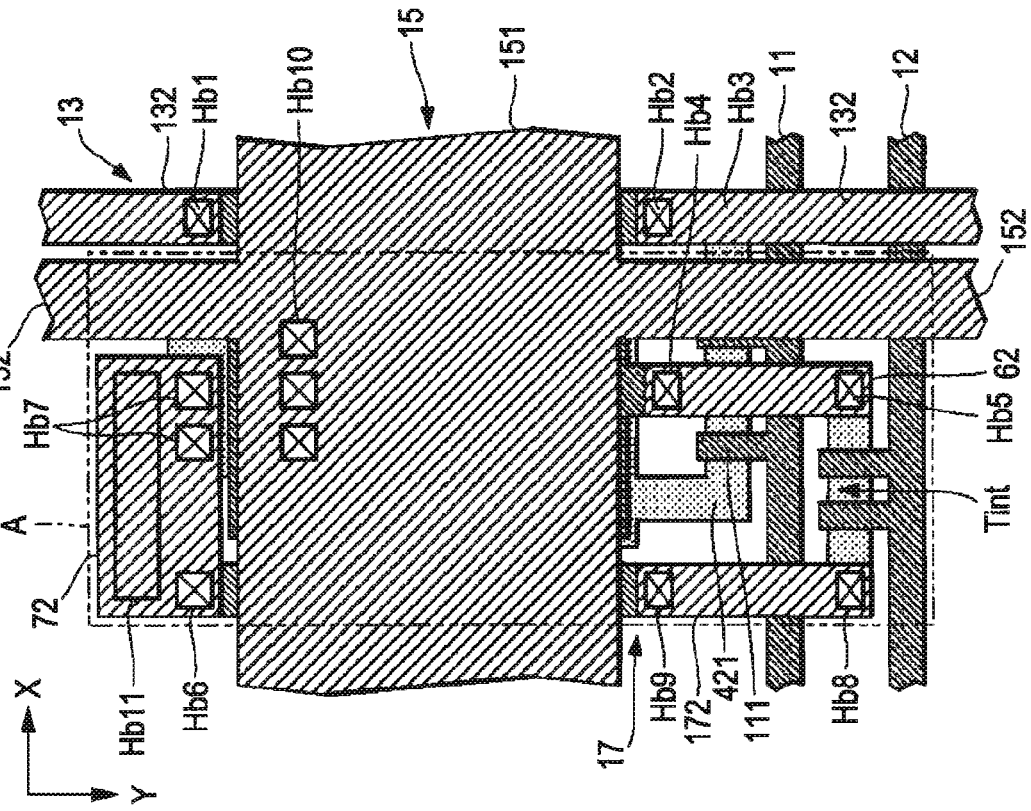
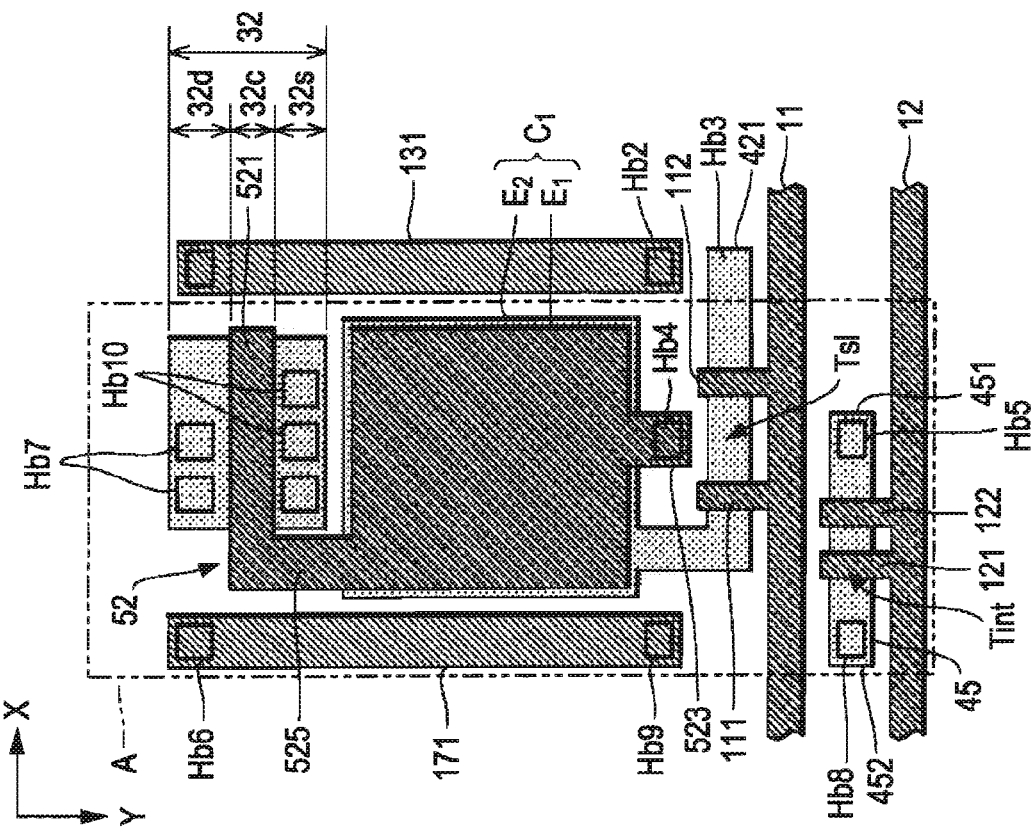

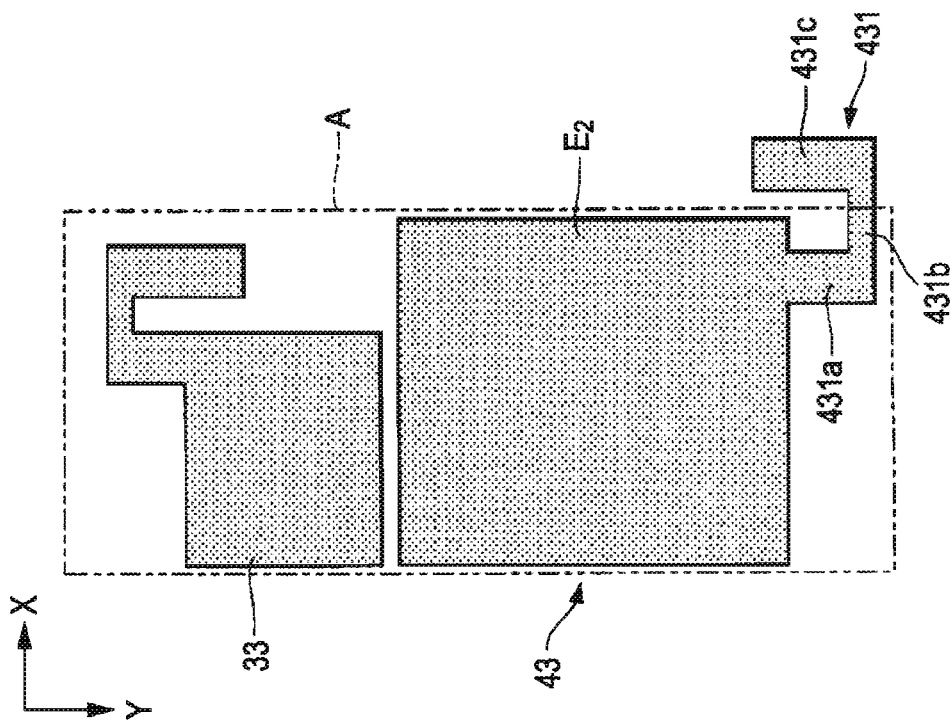
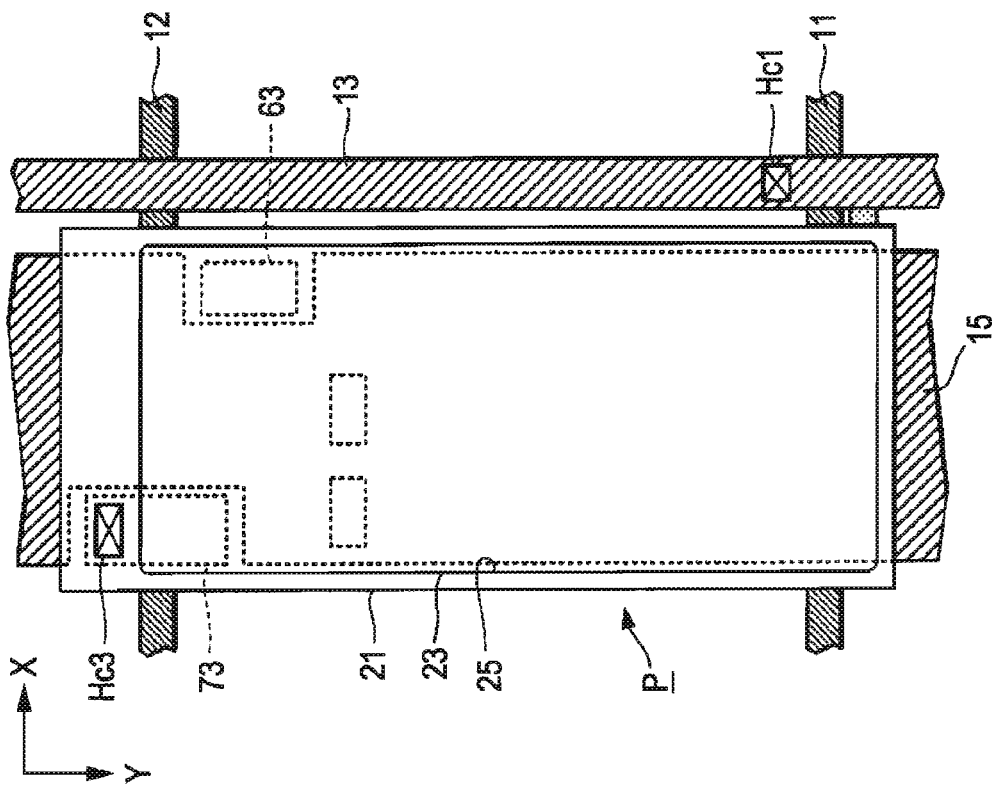

LIGHT-EMITTING DEVICE AND ELECTRONIC APPARATUS HAVING A POWER SOURCE LINE THAT OVERLAPS A CAPACITOR ELEMENT

The present application claims priority from Japanese Patent Application No. 2005-345298, filed in the Japanese Patent Office on Nov. 30, 2005, the entire disclosure of which is hereby incorporated by reference in its entirety.

BACKGROUND

1. Technical Field

The present invention relates to a structure of a light-emitting device utilizing a luminescent material such as an organic electroluminescent (EL) material or the like.

2. Related Art

An active matrix light-emitting device has been proposed, in which transistors (referred to as "drive transistors" hereinafter) are disposed for respective light-emitting elements, for controlling the quantity of current supplied to each light-emitting element according to the gate potential (refer to, for example, Japanese Unexamined Patent Application Publication No. 2004-119219). A capacitor element is connected to a gate electrode of a drive transistor, for setting and storing the potential thereof, The drive transistor is electrically connected to each light-emitting element through a source metal patterned in a predetermined shape.

In order to comply with the requirements of higher-definition light-emitting elements and miniaturization of light-emitting devices, it is necessary to closely dispose components relating to each light-emitting element to decrease the area of each light-emitting element. However, in this case, a capacity is parasitic between adjacent components. For example, in the above-described configuration, a source metal and an electrode of a capacitor element are disposed adjacent to each other so as to overlap through an insulating layer provided therebetween, and thus a capacity easily occurs therebetween. There is thus the problem of inhibiting high-precision control of the behavior of a light-emitting element (emission time and quality of light) due to the capacity parasitic to each component.

SUMMARY

An advantage of the invention is to suppress a parasitic capacity influencing on light emission of a light-emitting element.

According to a first aspect of the invention, a light-emitting device includes a drive transistor for controlling the quantity of current supplied to a light-emitting element, a capacitor element (e.g., a capacitor element C1 shown in FIG. 2 or a capacitor element C2 shown in FIGS. 25 and 26) electrically connected to a gate electrode of the drive transistor, and an electrical continuity portion (e.g., an electrical continuity portion 71, 72, or 73 in each embodiment) for electrically connecting the drive transistor and the light-emitting element, these elements being disposed on a substrate. The electrical continuity portion is disposed on the side opposite to the capacitor element with the drive transistor disposed therebetween. The light-emitting device will be described below with reference to first to third embodiments of the invention.

In this configuration, the electrical continuity portion is disposed on the side opposite to the capacitor element with the drive transistor provided therebetween, and thus a capacity parasitic to the capacitor element and the electrical continuity portion is decreased, as compared with a configuration in which the electrical continuity portion is disposed in the space between the drive transistor and the capacitor element. Therefore, a variation in potential of one of the capacitor element and the electrical continuity portion has a smaller effect on the potential of the other.

The capacitor element is typically used for setting or storing the potential of the gate electrode of the drive transistor. For example, the capacitor element (e.g., the capacitor element C1 shown in FIG. 2) is interposed between the gate electrode of the drive transistor and a data line. In this case, the gate electrode of the drive transistor is set to a potential by capacity coupling in the capacitor element according to a variation in potential of the data line. Alternatively, the capacitor element (the capacitor element C2 shown in FIGS. 25 and 26) may be interposed between the gate electrode of the drive transistor and wiring (e.g., a power line) to which a given potential is supplied. In this case, the potential supplied to the gate electrode of the drive transistor is held in the capacitor element.

The drive transistor preferably includes a semiconductor layer having a channel region formed therein and a gate electrode opposed to the channel region with a gate insulating layer provided therebetween. The capacitor element preferably includes a first electrode (e.g., an electrode E1 shown in FIG. 2) electrically connected to the gate electrode and a second electrode (e.g., an electrode E2 shown in FIG. 2) opposed to the first electrode with the gate insulating layer provided therebetween. The electrical continuity portion is preferably formed on the surface of an insulating layer (e.g., a first insulating layer L1 shown in FIG. 4) covering the gate electrode and the first electrode. In this case, the electrical continuity portion is formed using a layer different from that of the drive transistor and the capacitor element, thereby further decreasing a capacity parasitic between the electrical continuity portion and the capacitor element.

The first electrode of the capacitor element is more preferably connected to the gate electrode of the drive transistor (e.g., an intermediate conductor 51, 52, or 53 in each embodiment). In this case, the space between the drive transistor and the capacitor element can be decreased, as compared with a configuration in which the first electrode and the gate electrode are formed with a space therebetween.

In addition, the semiconductor layer of the drive transistor and the second electrode of the capacitor element are preferably formed using the same layer. In this case, simplification and cost reduction of the manufacturing process can be realized, as compared with a case in which the semiconductor layer and the capacitor element are formed using respective layers. In the invention, the expression "a plurality of components is formed using the same layer" means that a plurality of components is formed by selectively removing a common film (which may be either a single-layer or multilayer film) in the same step regardless of whether the components are separated from or connected to each other.

The light-emitting device preferably further includes a selection transistor which is turned on or off according to a selection signal so that the gate electrode of the drive transistor is set to a potential according to the data signal supplied from a data line through the selection transistor turned on. The selection transistor is disposed in a region opposite to the drive transistor with the capacitor element provided therebetween. More preferably, the semiconductor layer of the selection transistor is connected to the second electrode (e.g., a semiconductor layer 41, 42, or 43) so that the potential of the gate electrode of the drive transistor is set according to a variation in potential of the second electrode due to the supply of a data signal (capacity coupling by the capacitor element).

In this case, the semiconductor layer of the selection transistor is formed to continue to the second electrode, thereby realizing simplification and cost reduction of the manufacturing process in comparison to a configuration in which these are formed using respective layers.

The light-emitting device may further includes an initialization transistor which is turned on or off according to an initialization signal so that diode connection is made in the drive transistor through the turned-on initialization transistor The initialization transistor is disposed in a region opposite to the capacitor element with the drive transistor provided therebetween. In this case, the gate electrode of the drive transistor in which diode connection is made through the initialization transistor is set to a potential according to the threshold voltage of the drive transistor. Therefore, error of the threshold voltage of the drive transistor can be compensated for.

The light-emitting device may further include a selection transistor disposed on the side opposite to the drive transistor with the capacitor element provided therebetween so that the selection transistor is turned on or off according to a selection signal, and an initialization transistor disposed on the side opposite to the capacitor element with the selection transistor provided therebetween so that the initialization transistor is turned on or off according to an initialization signal. The gate electrode of the drive transistor is set to a potential according to the data signal supplied from a data line through the turned-on selection transistor, diode connection is made in the drive transistor through the turned-off initialization transistor, and the initialization transistor is electrically connected to the gate electrode of the drive transistor through a connecting portion (e.g., a connecting portion 62 shown in FIG. 15). The gate electrode of the selection transistor does not overlap the connecting portion.

In this case, the connecting portion is formed so as not to overlap the gate electrode of the selection transistor, thereby decreasing capacity coupling between the selection transistor (or a selection line for transmitting the selection signal) and the connecting portion, as compared with a case in which the gate electrode overlaps the connecting portion. Therefore, noise of the waveform of the selection signal due to a variation in potential of the connecting portion can be suppressed, resulting in a high-speed operation of the selection transistor with predetermined timing.

The selection transistor preferably includes a first gate electrode (e.g., a first gate electrode 111 shown in FIG. 14) and a second gate electrode (e.g., a second gate electrode shown in FIG. 14), which are disposed with a space therebetween, and the connecting portion is located in the space between the first gate electrode and the second gate electrode. In this case, when the selection transistor has a dual gate structure, a leakage current of the selection transistor can be decreased. Furthermore, the connecting portion is provided so as not to overlap the first gate electrode and the second gate electrode, and thus capacity coupling between the selection transistor and the connecting portion can be securely suppressed.

The light-emitting device is applied to various electronic apparatuses. Typical examples of such electronic apparatuses include apparatuses using a light-emitting device as a display device, such as personal computers and cellular phones. The application of the light-emitting device is not limited to image display devices. For example, the light-emitting device can be used for various applications, such as an exposure apparatus (exposure head) for forming a latent image on an image support such as a photosensitive drum by irradiation of light beams; illuminating apparatuses, such as an apparatus disposed at the rear of a liquid crystal device, for illuminating the device; and an apparatus mounted on an image reading device such as a scanner, for illuminating an original; and the like.

BRIEF DESCRIPTION OF THE DRAWINGS

The invention will be described with reference to the accompanying drawings, wherein like numbers reference like elements.

FIG. 12 is a plan view showing the configuration of a unit element according to a second embodiment of the invention.

FIG. 13 is a plan view showing the step of forming a gate insulating layer.

FIG. 14 is a plan view showing the step of forming a first insulating layer.

FIG. 15 is a plan view showing the step of forming a second insulating layer.

FIG. 17 is a plan view showing the step of forming a first insulating layer in a modified example of the second embodiment.

FIG. 18 is a plan view showing the step of forming a second insulating layer in a modified example of the second embodiment.

FIG. 19 is a plan view showing the configuration of a unit element according to a third embodiment of the invention.

FIG. 20 is a plan view showing the step of forming a gate insulating layer.

DETAILED DESCRIPTION OF EMBODIMENTS

<A: Electric Configuration of Light-Emitting Device>

Figure 1:
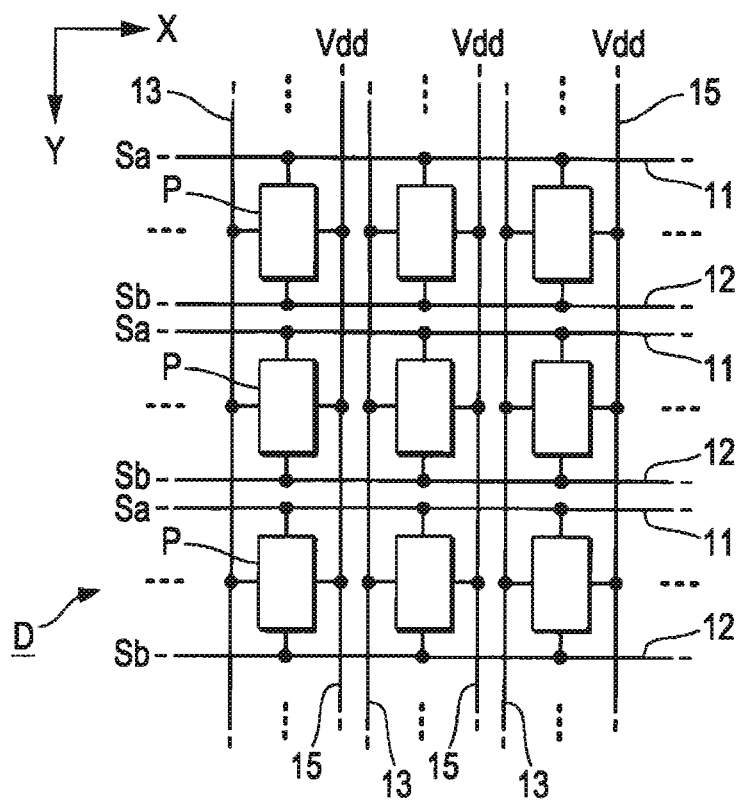
FIG. 1 block diagram showing an array of a plurality of unit elements in a light-emitting device.

FIG. 1 is a block diagram showing the electric configuration of a light-emitting device D according to first to third embodiments of the invention. As shown in this figure, the light-emitting device D includes a plurality of selection lines 11, a plurality of initialization lines 12, and a plurality of data lines 13. Each selection line 11 and each initialization line 12 extend in the X direction. Each data line 13 extends in the Y direction perpendicular to the X direction. A unit element (pixel) P is disposed at each of the intersections of the pairs of the selection lines 11 and the initialization lines 12 and the data lines 13. Therefore, the unit elements P are arranged in a matrix in the X and Y directions Each of the unit elements P serves as a minimum unit element of light emission. Furthermore, a higher power potential Vdd is supplied to each unit element p through a corresponding power line 15.

Figure 2:
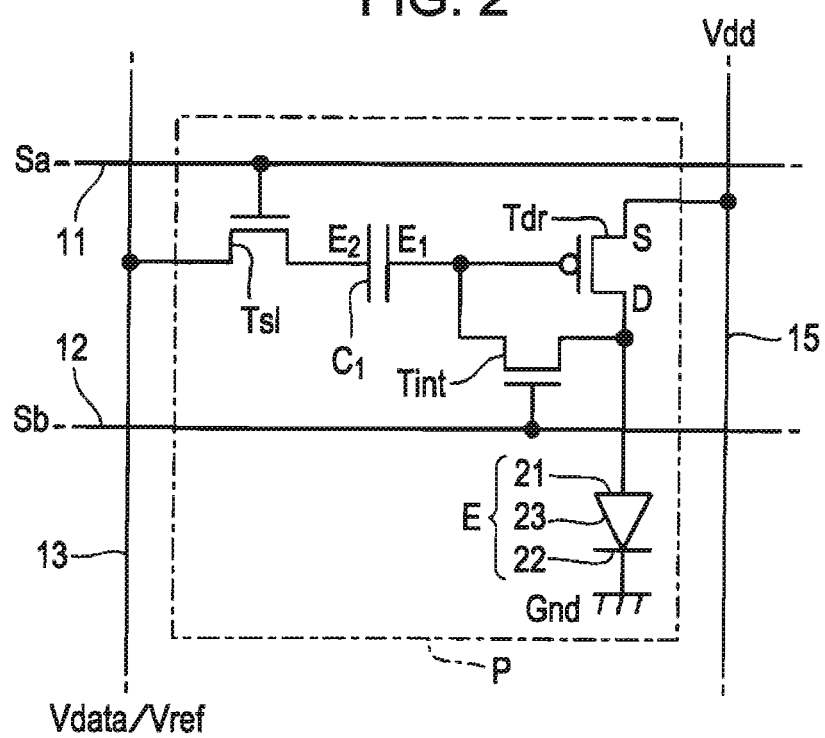
FIG. 2 is a circuit diagram showing an electric configuration of each unit element.

FIG. 2 is a circuit diagram showing the configuration of each unit element P. Referring to this figure, a light-emitting element E and a drive transistor Tdr are disposed on a path from the corresponding power line 15 to a grounding line (ground potential Gnd). The light-emitting element E includes a luminescent layer 23 composed of an organic EL material and interposed between a first electrode 21 (anode) and a second electrode 27 (cathode). The first electrode 21 is formed separately for each of the unit elements P, while the second electrode 22 is continuously formed for the plurality of unit elements P and grounded (Gnd). The luminescent layer 23 emits light in a quantity depending on the quantity of the current passing from the first electrode 21 to the second electrode 22.

The drive transistor Tdr is a p-channel-type thin-film transistor for controlling the quantity of the current supplied to the light-emitting element E according to the potential (referred to as the "gate potential" hereinafter) Vg of a gate electrode. A source electrode (S) of the drive transistor Tdr is connected to the corresponding power line 15, and a drain electrode (D) thereof is connected to the first electrode 21 of the light-emitting element E.

Furthermore, an n-channel-type transistor (referred to as the "initialization transistor" hereinafter) Tint is interposed between the gate electrode and the drain electrode (the first electrode 21 of the light-emitting element E) of the drive transistor Tdr, for controlling the electric connection therebetween. A gate electrode of the initialization transistor Tint is connected to the corresponding initialization line 12. In addition, an initialization signal Sb is supplied to each of the initialization lines 12 from a drive circuit (not shown in the drawing). When the initialization signal Sb is bought into an active level to turn the initialization transistor Tint on, the gate electrode and the drain electrode of the drive transistor Tdr are electrically connected to each other (diode connection).

As shown in FIG. 2, the unit element P includes a capacitor element C1 including electrodes E1 and E2. The electrode E1 is connected to the gate electrode of the drive transistor Tdr, and an n-channel-type transistor (referred to as a "selection transistor" hereinafter) Tsl is interposed between the electrode E2 and the corresponding data line 13, for controlling the electric connection therebetween. A gate electrode of the selection transistor Tsl is connected to the corresponding selection line 11. A selection signal Sa is supplied to each of the selection lines 11 from a drive circuit (not shown in the drawing). The conductivity types of the drive transistor Tdr, the selection transistor Tsl, and the initialization transistor Tint may be appropriately changed from those in the example shown in FIG. 2.

Next, the operation of each unit pixel P will be described below on the basis of the divided periods thereof, i.e., an initialization period, a write period, and a drive period. First, in the initialization period, a predetermined potential Vref is supplied to the corresponding data line 13 from the drive circuit (not shown in the drawing), and the selection signal Sa of the corresponding selection line and the initialization signal Sb of the corresponding initialization line 12 are kept at an active level (high level). Therefore, the potential Vref is supplied to the electrode E2 of the capacitor element C1 from the corresponding data line 13 through the selection transistor Tsl. Also, the initialization transistor Tint is turned on to make diode connection in the drive transistor Tdr. Therefore, the gate potential Vg of the drive transistor Tdr is converged to a difference (Vg=Vdd−Vth) between the power potential Vdd supplied to the corresponding power line 15 and the threshold potential Vth of the drive transistor Tdr.

Next, during the write period after the passage of the initialization period, the initialization signal Sb is transferred to a non-active level (low level). Consequently, the initialization transistor Tint is turned off to remove the diode connection in the drive transistor Tdr. Also, the potential Vref supplied to the electrode E2 from the corresponding data line 13 is changed to a data potential Vdata while the selection transistor Tsl is maintained in an off state. The data potential Vdata depends on the specified gradation of the unit element P.

When the potential Vref of the electrode E2 is changed to the data potential Vdata by a variation ΔV (=Vref−Vdata), since the impedance of the gate electrode of the drive transistor Tdr is sufficiently high, the potential of the electrode E1 is changed from the potential Vg (=Vdd−Vth) set in the initialization period due to capacity coupling in the capacitor element C1. The variation of the potential of the electrode E1 depends on the capacity ratio of the capacitor element C1 to another parasitic capacity (for example, the gate capacity of the drive transistor and a capacitor parasitic to other wiring). More specifically, the variation of the potential of the electrode E1 is expressed by ΔV·C/(C+Cs) wherein C is the capacity value of the capacitor element C1, and Cs is the capacity value of the parasitic capacity. Therefore, at the end point of the write period, the gate potential Vg of the drive transistor Tdr is set to a level represented by the following equation (1):

$$Vg = Vdd - Vth - k \cdot \Delta V \qquad (1)$$

wherein k=C/(C+Cs).

In the next drive period after the passage of the write period, the selection signal Sa is transferred to a non-active level to turn the selection transistor Tsl off. A current corresponding to the gate potential Vg of the drive transistor Tdr is supplied to the light-emitting element E from the corresponding power line 15 through the source and drain electrodes of the drive transistor Tdr. As a result of supply of the current, the light-emitting element E emits light in a quantity corresponding to the data potential Vdata.

Here, assuming that the drive transistor Tdr is operated in a saturation region, the quantity I of the current supplied to the light-emitting element E during the drive period is expressed by the following equation (2):

$$I = (\beta/2)(Vgs - Vth)^2 \quad (2)$$
$$= (\beta/2)(Vdd - Vg - Vt)^2$$

wherein β is the grain coefficient of the drive transistor Tdr, and Vgs is the voltage between the source and drain of the drive transistor Tdr.

Substituting equation (1) into equation (2) gives the following equation:

$$I = (\beta/2)(k \cdot \Delta V)^2$$

Namely, the quantity I of the current supplied to each light-emitting element does not depend on the threshold voltage Vth of the drive transistor Tdr. Therefore, in this embodiment, it is possible to suppress error (luminance variation) of the quantity of light of each light-emitting element E, which is caused by variations (differences from a design value and from the drive transistors Tdr of other unit elements) in the threshold voltages Vth of the drive transistor Tdr.

<B: Specific Structure of Unit Element P>

Next, the specific structure of the above-described unit element P will be described with reference to the drawings. In each of the drawings referred to below, the dimensions and ratios of each component are appropriately changed from the actual values for the convenience sake.

<B-1: First Embodiment>

Figure 3:
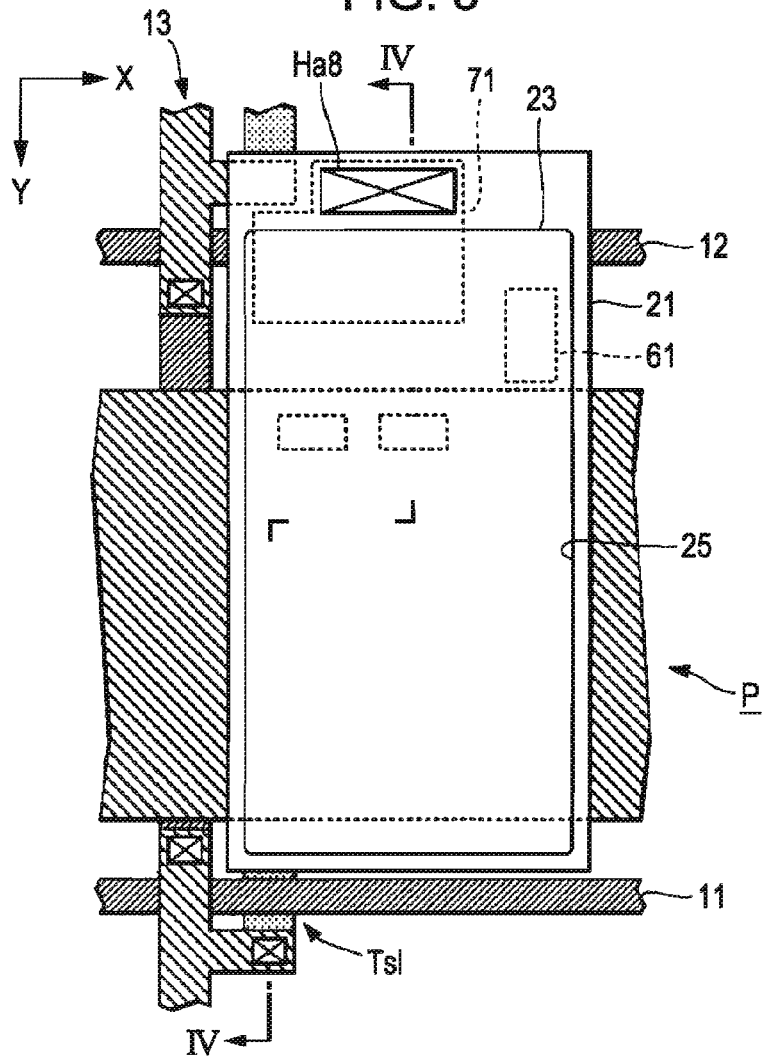
FIG. 3 is a plan view showing the configuration of one element according to a first embodiment of the invention.
Figure 4:
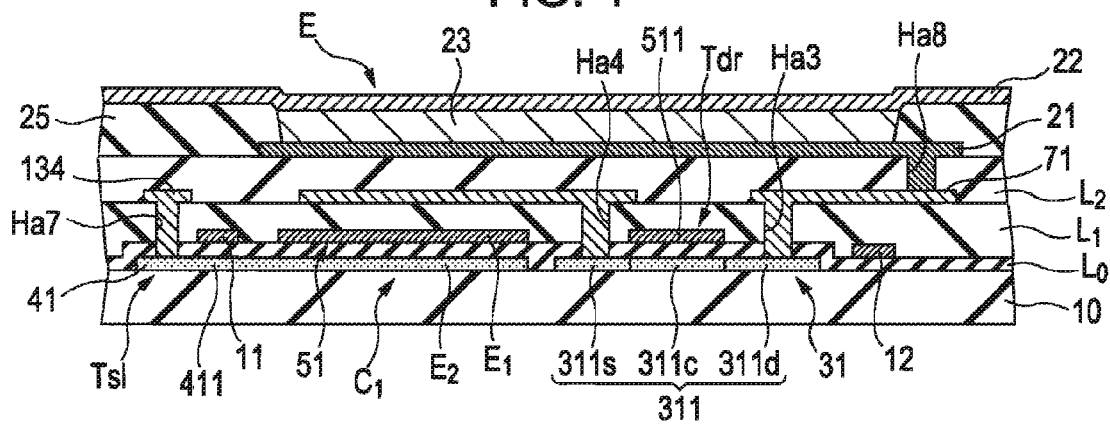
FIG. 4 is a sectional view taken along line IV-IV in FIG. 3.

First, description will be made of the specific structure of the unit element P in a light-emitting device D according to a first embodiment of the invention. FIG. 3 is a plan view showing the configuration of one unit element P, and FIG. 4 is a sectional view taken along line IV-IV in FIG. 3. Although FIG. 3 is a plan view, a component common to that shown in FIG. 4 is hatched in a similar manner to in FIG. 4 in order to facilitate the understanding of each component. This applies to the other plan views referred to below.

As shown in FIG. 4, the components such as the drive transistor Tdr and the light-emitting element E shown in FIG. 2 are formed on the surface of a substrate 10. The substrate 10 is a plate-shaped member composed of any one of various insulating materials, such as glass and plastics. The components of the unit element P may be formed on an insulating film (e.g., a film of silicon oxide or silicon nitride) provided as an underlying film on the surface of the substrate 10 to cover the substrate 10. The light-emitting device D of this embodiment is a top-emission type, and thus the substrate 10 need not have light transmittance.

Figure 6:
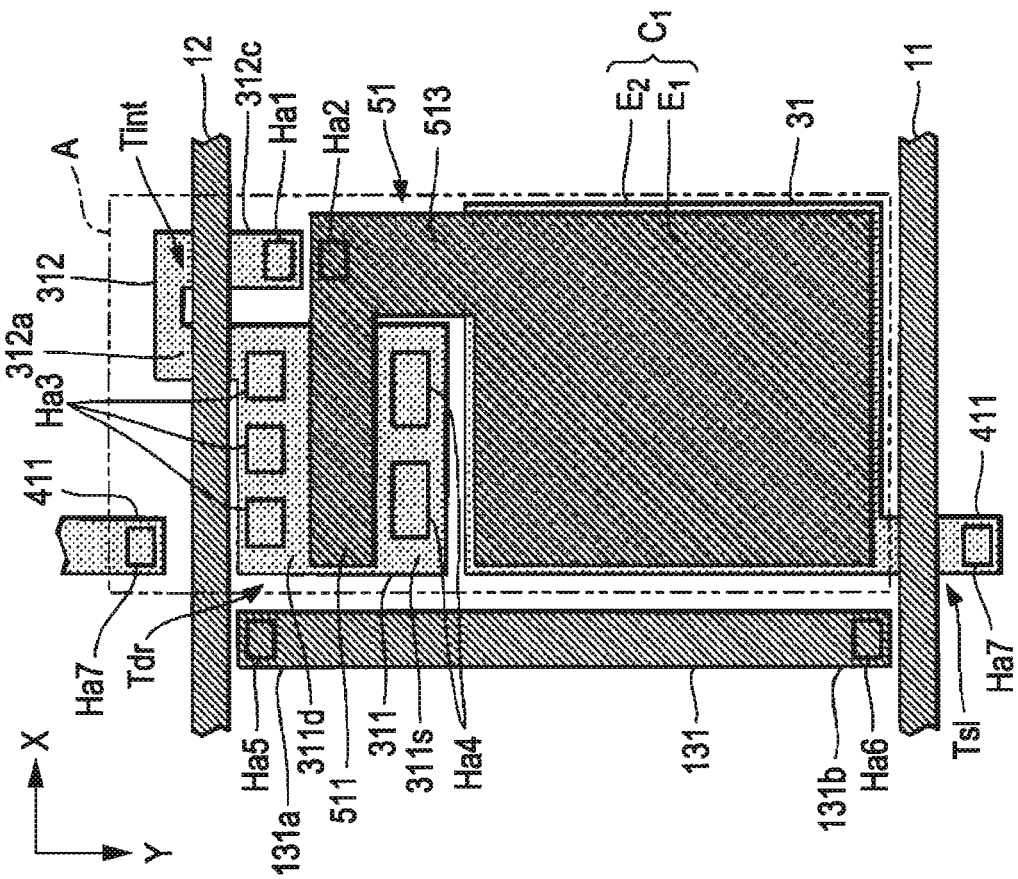
FIG. 6 is a plan view showing the step of forming a first insulating layer.
Figure 5:
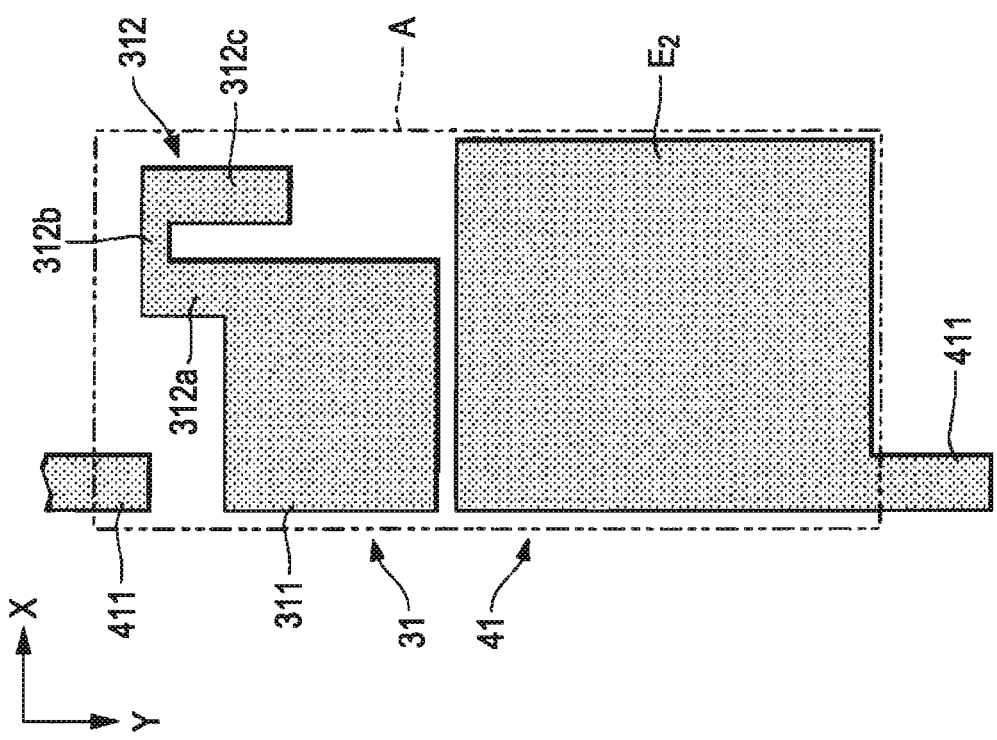
FIG. 5 is a plan view showing the step of forming a gate insulating layer.
Figure 7:
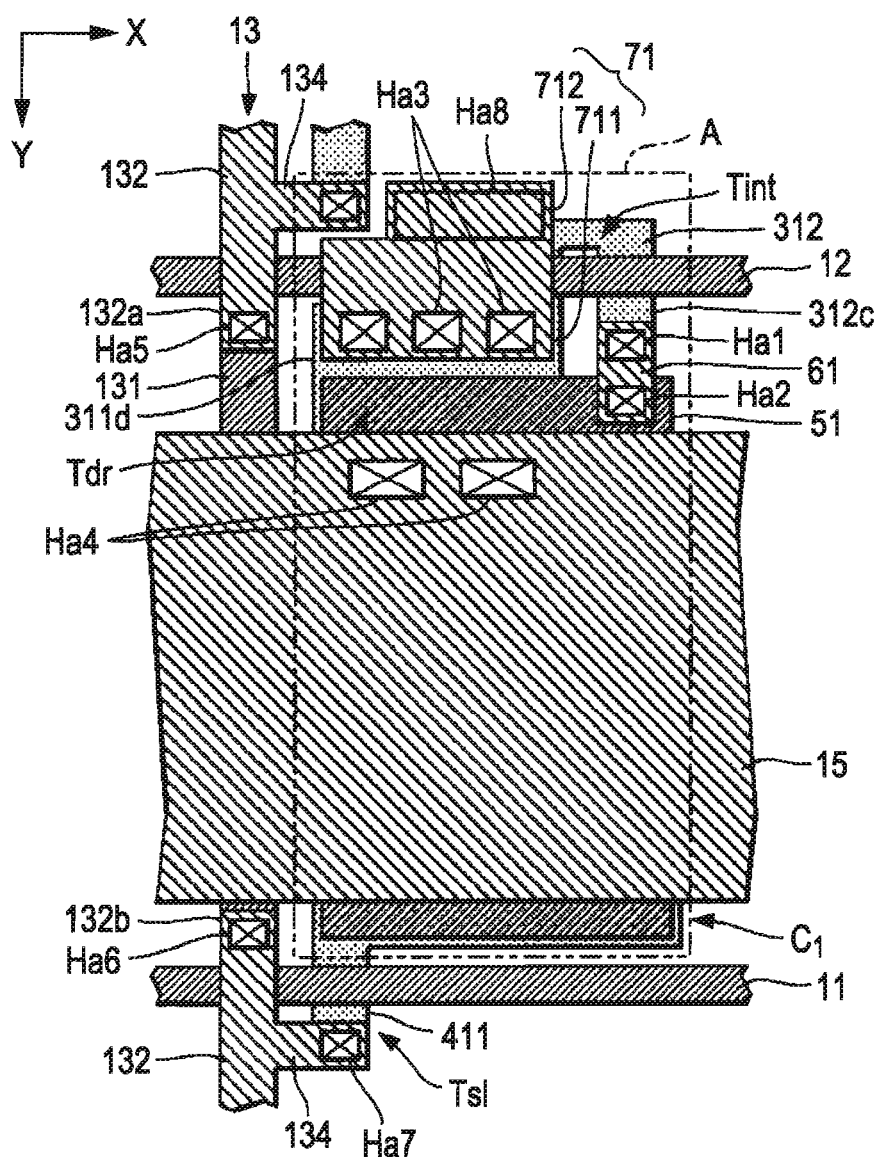
FIG. 7 is a plan view showing the step of forming a second insulating layer.

FIGS. 5 to 7 are plan views showing the surface of the substrate 10 in respective steps for forming the unit element P thereon. In each of FIGS. 5 to 7, a region A in which the first electrode 21 shown in FIG. 3 is to be formed is shown by a two-dot chain line.

As shown in FIGS. 4 and 5, a semiconductor layer 31 and a semiconductor layer 41 are formed on the surface of the substrate 10 using a semiconductor material such as silicon or the like. The semiconductor layers 31 and 41 are simultaneously formed by patterning a film, which has been formed over the entire region of the substrate 10, in the same step. Like in the relation between the semiconductor layers 31 and 41, when a plurality of components is formed by selectively removing a common film (which may be a single layer or multi-layer) in the same step, this is simply expressed by "forming using the same layer" hereinafter. The components formed using the same layer are inevitably composed of the same material and have substantially the same thickness. The structure in which a plurality of components is formed using the same layer has the advantage of realizing simplification and cost reduction of the manufacturing process, as compared with a structure in which the components are formed using respective layers.

As shown in FIGS. 4 and 5, the semiconductor layer 31 includes a first element part 311 and a second element part 312. The first element part 312 is a substantially rectangular part functioning as a semiconductor layer of the drive transistor Tdr. The second element part 312 functions as a semiconductor layer of the initialization transistor Tint and is formed in a region (i.e., at the upper right of the first element part 312) on the positive side in the X direction and on the negative side in the Y direction as seen from the first element part 311. In further detail, as shown in FIG. 5, the second element part 312 includes a portion 312a continuing from the first element part 311 to the negative side in the Y direction, a portion 312b extending from the portion 312a to the positive side in the Y direction, and a portion 312c extending from the portion 312b to the positive side in the Y direction.

The semiconductor layer 41 is disposed on the positive side in the Y direction as seen from the semiconductor layer 31 and includes a substantially rectangular electrode E2 constituting the capacitor element C1 and an element part 411 extending from the electrode E2 in the Y direction. The element part 411 functions as a semiconductor layer of the selection transistor Tsl and is formed in a region (i.e., at the lower left of the electrode E2) on the negative side in the X direction and on the positive side in the Y direction as seen from the electrode E2.

Referring to FIG. 4, the entire surface of the substrate 10 on which the semiconductor layers 31 and 41 have been formed is covered with a gate insulating layer L0. As shown in FIGS. 4 and 6, the selection lines 11, the initialization lines 12, intermediate conductors 51, and first data line parts 131 are formed on the surface of the gate insulating layer L0 using the same layer composed of a conductive material.

Each of the selection lines 11 extends over a plurality of unit elements P in the X direction so as to overlap the element parts 411 of the semiconductor layers 41. In each element part 411, a region opposite to the corresponding selection line 11 with the gate insulating layer L0 provided therebetween is a channel region of the selection transistor Tsl. Each of the initialization lines 12 extends over a plurality of unit elements P in the X direction so as to overlap the second element parts 312 of the semiconductor layers 31. In each of the second element portions 312a and 312c of the second element part 312, a region opposite to the corresponding initialization line 12 with the gate insulating layer L0 provided therebetween is a channel region of the initialization transistor Tint. In other words, in this embodiment, the initialization transistor Tint is a dual-gate structure transistor.

Each of the intermediate conductors 51 is formed in the space between the corresponding selection line 11 and initialization line 12 and includes an electrode E1, a gate electrode 511 and a connecting portion 513. The electrode E1 is a substantially rectangular part overlapping the electrode E2 of the semiconductor layer 41 in the vertical direction to the substrate 10. As shown in FIGS. 4 and 6, the electrodes E1 and E2 are opposed each other with the gate insulating layer L0 (dielectric) provided therebetween to form the capacitor element C1 shown in FIG. 2.

The connecting portion 513 extends from an upper right portion of the electrode E1 to the negative side in the Y direction. The gate electrode 511 extends from the connecting portion 513 with a space from the electrode E1 to the negative side in the X direction and overlaps the first element part 311 over the entire width (X-direction dimension) of the first element part 311. As shown in FIG. 4, in the first element part 311, a region opposite to the gate electrode 511 with the gate insulating layer L0 provided therebetween is a channel region 311c of the drive transistor Tdr. Also, in the first element part 311, a region (i.e., a region between the gate electrode 511 and the electrode E1 in the Y direction, as shown in FIG. 6) nearer to the electrode E1 than the channel region 311c is a source region 311s, the opposite region being a drain region 311d.

Each of the first data line parts 131 constitutes the corresponding data line 13 shown in FIG. 2. Each of the first data line parts 131 is disposed on the negative side in the X direction as seen from the intermediate conductor 51 and extends in the Y direction between the corresponding selection line 11 and initialization line 12.

Figure 8:
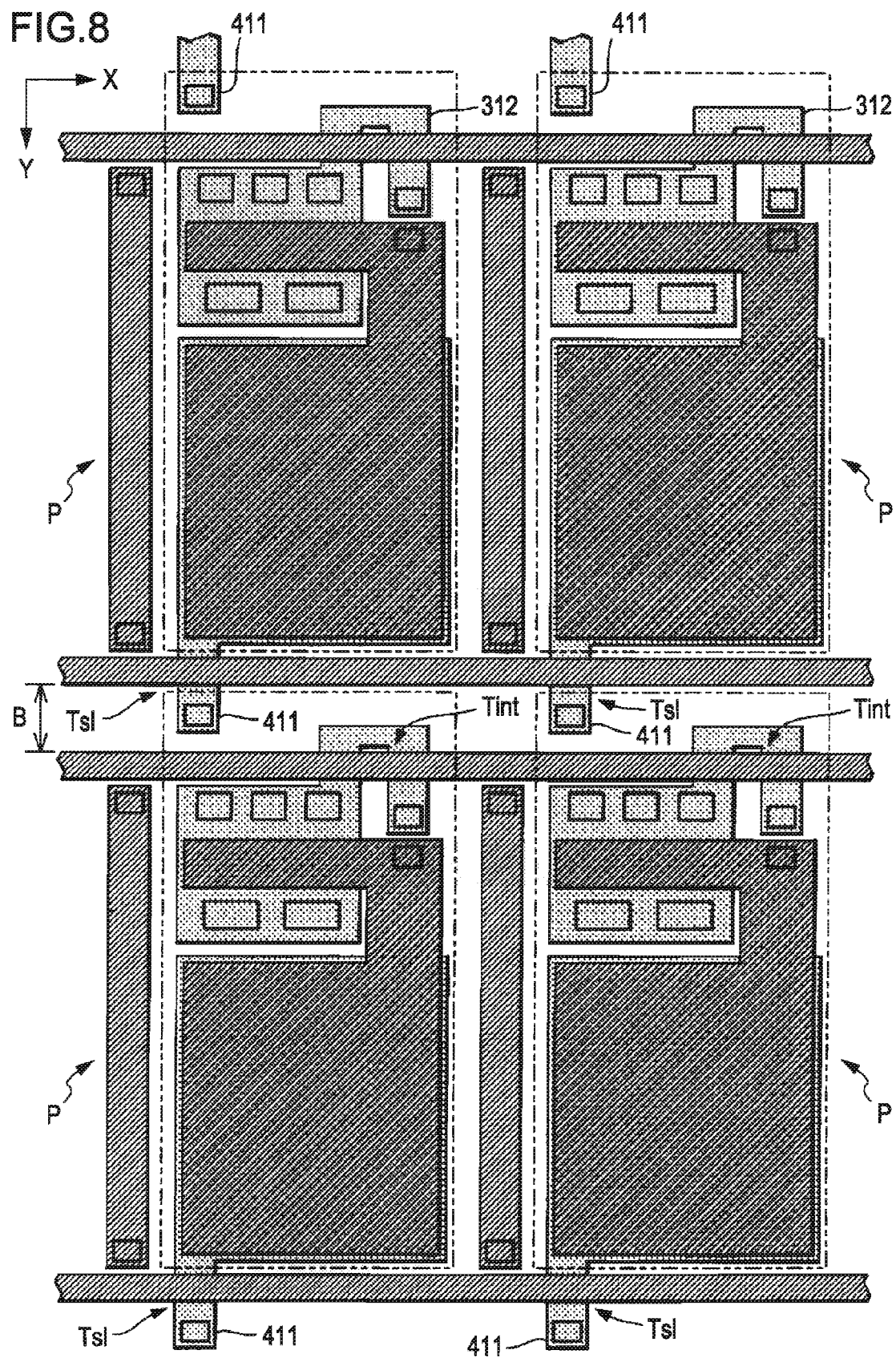
FIG. 8 is a plan view showing a plurality of unit elements in the step of forming the first insulating layer.

FIG. 8 is a plan view showing a state in which four unit elements P in the step shown in FIG. 6 are arranged in the X direction and Y direction. As shown in FIGS. 6 and 8, in each unit element P, the second element part 312 (initialization transistor Tint) formed at the edge on the negative side in the Y direction is located on the positive side in the X direction, and the element part 41 (selection transistor Tsl) formed at the edge on the positive side in the Y direction is located on the negative side in the X direction.

Assuming that in each unit element P, the second element part 312 and the element part 411 are disposed on the same side in the X direction, in order to securely space the second element parts 312 and the element parts 411, it is necessary to secure sufficient a region (corresponding to the region B shown in FIG. 8) between the adjacent unit elements P in the Y direction, thereby causing the problem of inhibiting an increase in definition of unit elements P. However, in each unit element P according to the first embodiment, the second element part 312 and the element part 411 are located at difference positions in the X direction. Therefore, as shown in FIG. 8, the second element parts 312 and the element parts 411 are alternately disposed in the region B along the X direction. In this configuration, even when the region B is narrowed, the second element parts 312 and the elements 411 are securely spaced. There is thus the advantage of facilitating an increase in definition of unit elements P.

As shown in FIG. 4, the surface of the gate insulating layer L0 on which the intermediate conductors 51 and the first data line parts 131 have been formed is covered with a first insulating layer L1 over the entire region thereof. As shown in FIGS. 4 and 7, connecting portions 61, electrical continuity portions 71, the power lines 15, and second data line parts 132 are formed on the surface of the first insulating layer L1 using the same layer composed of a conductive material.

As shown in FIG. 7, each connecting portion 61 overlaps the intermediate conductor 51 (gate electrode 511) and the end of the portion 312c of the second element part 312 on the positive side in the Y direction. The connecting portion 61 is electrically conducted to the portion 312c through a contact hole Ha1 passing through the first insulating layer L1 and the gate insulating layer L0 and to the intermediate conductor 51 through a contact hole Ha2 passing through the first insulating layer L1. Namely, the gate electrode 511 (the electrode E1 of the capacitor element C1) of the drive transistor Tdr and the initialization transistor Tint are electrically connected to each other through the connecting portion 61. In this specification, the term "contact hole" means a portion for electrically connecting a component on one of the sides of an insulating layer to a component on the other side, more specifically a portion (hole) passing through the insulating layer in the thickness direction. The contact hole may have any planar shape.

Each of the electrical continuity portions 71 is interposed between the drive transistor Tdr and the light-emitting element E, for electrically connecting both, and is disposed in a region (i.e., a region on the negative side in the Y direction with respect to the drive transistor Tdr) opposite to the capacitor element C1 with the drive transistor Tdr provided therebetween in the Y direction of the substrate 10. In this embodiment, each electrical continuity portion 711 has a form in which a portion 711 overlapping the drain region 311d of the fist element part 311 in the vertical direction to the substrate 10 continues to a portion 712 opposite to the part 711 with the corresponding initialization line 12 provided therebetween.

In the first insulating layer L1, a plurality of contact holes Ha3 is formed in a region overlapping the drain region 311d in the vertical direction of the substrate 10 so that the contact holes Ha3 pass through the first insulating layer L1 and the gate insulating layer L0. These contact holes Ha3 are arranged in the X direction (i.e., the channel width direction of the drive transistor Tdr) in which the gate electrode 51 extends. The portion 711 of each electrical continuity portion 71 is electrically conducted to the drain region 311d through the contact holes Ha3.

Figure 9:
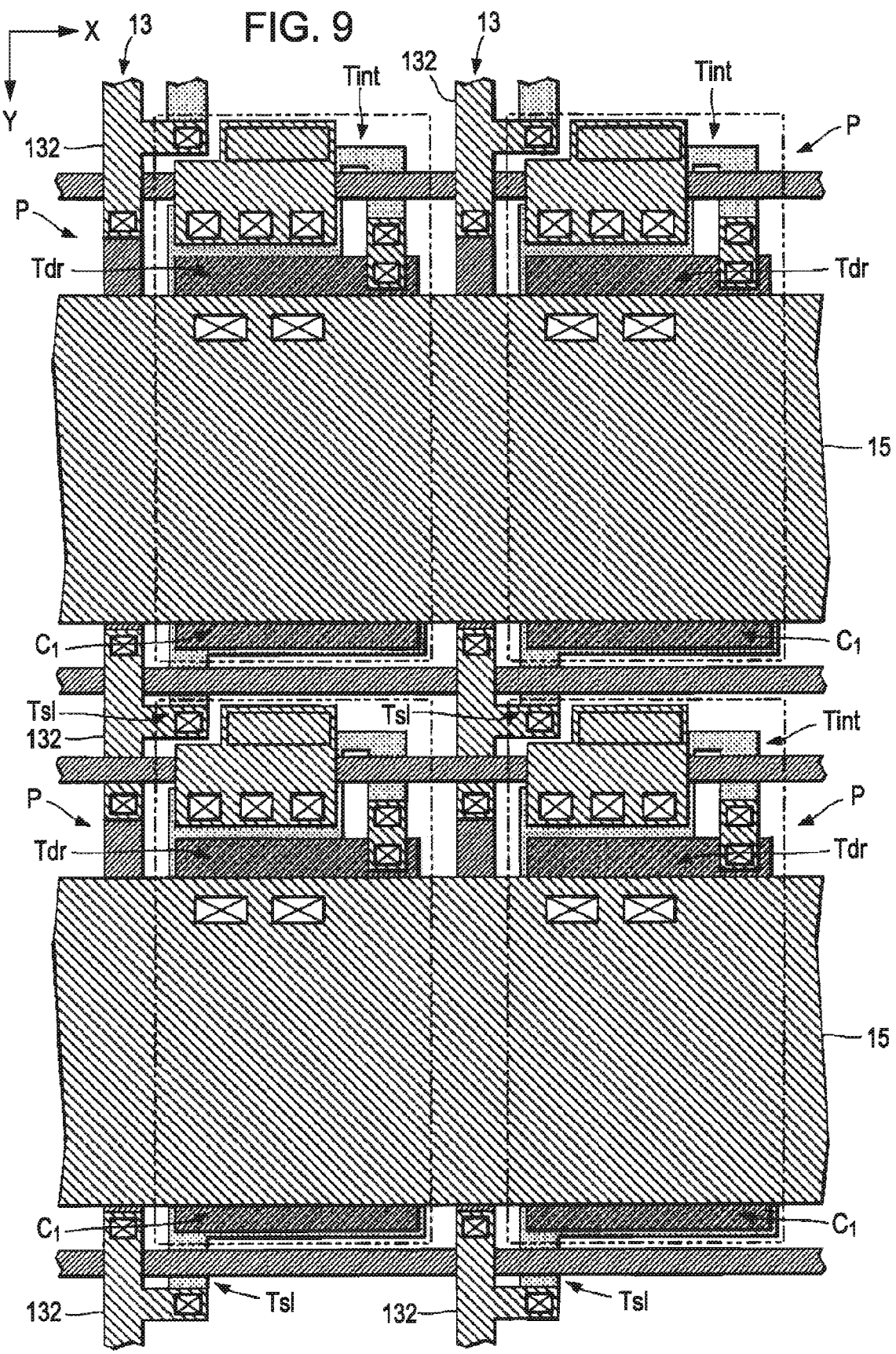
FIG. 9 is a plan view showing a plurality of unit elements in the step of forming the second insulating layer.

FIG. 9 is a plan view showing a state in which the four unit elements P in the step shown in FIG. 8 are arranged in the X direction and Y direction. As shown in FIGS. 7 and 9, the power lines 15 serve as stripe wiring extending along the direction of arrangement of a plurality of unit elements P in the X direction. Each of the power lines 15 overlaps the capacitor elements C1 of the unit elements P and the source regions 311s of the drive transistors Tdr in the vertical direction to the substrate 10. As shown in FIG. 7, in the first insulating layer L1, a plurality of contact holes Ha4 is formed in a region overlapping each of the source regions 311s so as to pass through the first insulating layer L1 and the gate insulating layer L0. These contact holes Ha4 are arranged in the X direction in which the gate electrodes 51 extend. Each of the power lines 15 is electrically conducted to the source regions 311s of the drive transistors Tdr through the contact holes Ha4.

In this embodiment, the shape and dimensions of the power lines 15 are selected so that each of the power lines 15 does not overlap the selection transistors Tsl (element parts 411), the selection lines 11, the initialization transistors Tint (second element parts 312), and the initialization lines 12 in the vertical direction of the substrate 10. In other words, as shown in FIG. 9, each of the power lines 15 extends in the X direction in the space between the array of the selection transistors Tsl along the corresponding selection line 11 and the array of the initialization transistors Tint along the corresponding initialization line 12.

The second data line parts 132 constitute the data lines 13 together with the first data line parts 131, and extend in the Y direction in the spaces between the respective power lines 15, as shown in FIGS. 7 and 9. As shown in FIG. 7, in each of the second data line parts 132, the end 132a on the positive side (lower side) in the Y direction overlaps the end 131a (refer to FIG. 6) of the corresponding first data line part 131 on the negative side (upper side) in the Y direction. The ends 132a and 131a are electrically conducted to each other through a contact hole Ha5 passing through the first insulating layer L1. Similarly, in each of the second data line parts 132, the end 132b on the negative side in the Y direction and the end 131b (refer to FIG. 6) of the corresponding first data line part 131 on the positive side in the Y direction are electrically conducted to each other through a contact hole Ha6. As described above, the first data line parts 131 and the second data line parts 132 which are alternately arranged in the Y direction are electrically connected to form the data lines 13 linearly extending in the Y direction.

As shown in FIG. 7, each of the second data line parts 132 has a branch pat 134 connected thereto. The branch part 134 is disposed opposite to the capacitor element C1 with the corresponding selection line 11 provided therebetween and extends in the X direction to overlap each element part 411 of the semiconductor layer 41. The branch part 134 is electrically conducted to each element part 411 through a contact hole Ha7 passing through the first insulating layer L1 and the gate insulating layer L0. Namely, the selection transistor Tsl and the corresponding data line 13 are electrically connected through the branch part 134.

Figure 10:
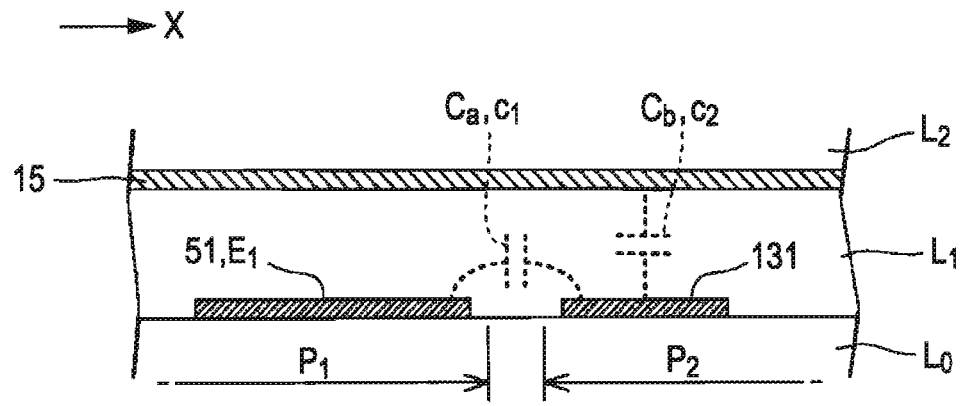
FIG. 10 is a sectional view illustrating the advantage of an embodiment of the invention.

As shown in FIGS. 7 and 9, the capacitor element C1 of each unit element P is adjacent to the data line 13 corresponding to the adjacent unit element P on the positive side in the X direction. FIG. 10 is an enlarged sectional view showing the vicinity of one unit element P1 and the other unit element P2 adjacent thereto on the positive side in the X direction. This figure shows the intermediate conductor 51 (particularly, the electrode E1 of the capacitor element C1) of the unit element P1 and the first data line part 131 of the data line 13 corresponding to the unit element P2.

Since the intermediate conductor 51 and the first data line part 131 are formed using the same layer and adjacent to each other, as shown in FIG. 10, the electrode E1 of the intermediate conductor 51 and the first data line part 131 are capacitively coupled with each other to be accompanied with a capacity (parasitic capacity) Ca produced therebetween. Therefore, the potential Vg of the electrode E1 (furthermore, the gate electrode 511 of the drive transistor Tdr) is actually influenced by a variation (the voltage corresponding to the gradation of the unit element P2) of the potential of the first data line part 131 corresponding to the unit element P2 while the potential Vg is basically determined only by a variation (the voltage corresponding to the gradation of the unit element P1) of the potential of the data line 13 corresponding to the unit element P1. Namely, the gate potential Vg of the drive transistor Tdr of each of the unit elements P cannot be precisely set, resulting in the possibility of producing error in the quantity of light of the light-emitting element E.

As shown in FIG. 7, each of the first data line parts 131 opposes the corresponding power line 15 with the first insulating layer L1 provided therebetween. Therefore, a capacity is formed between each of the first data line parts 131 and the corresponding power line 15. In this embodiment, as shown in FIG. 10, the capacity value c2 of the capacity Cb formed between the first data line part 131 of the unit element P2 and the power line 15 is larger than the capacity value c1 of the capacity Ca formed between the first data line part 131 and the intermediate conductor 51 (electrode E1) of the unit element P1. In this configuration, the influence on the intermediate conductor 51 (electrode E1) of the unit element P1 due to a variation of the potential of the first data line part 131 of the unit element P2 is decreased by the capacity Cb. Therefore, the gate potential Vg of the drive transistor Tdr in each unit element P and the quantity of light of the light-emitting element E corresponding to the gate potential Vg can be precisely set to desired values.

In this embodiment, the distance (thickness of the first insulating layer L1) between each first data line part 131 and the corresponding power line 15 and the distance between the intermediate conductor 51 of the unit element P1 and the first data line part 131 of the unit element P2 are selected so as to satisfy the above-described condition (c2>c1). In further detail, the distance (thickness of the first insulating layer L1) between the first data line part 131 of the unit element P2 and the corresponding power line 15 is smaller than the distance between the intermediate conductor 51 of the unit element P1 and the first data line part 131 of the unit element P2. In addition, the area in which the first data line part 131 of the unit element P2 is opposed to the corresponding power line 15 with the first insulating layer L1 provided therebetween (i.e., the overlap area between the first data line part 131 and the corresponding power line 15 in the vertical direction to the substrate 10) is larger than the area in which the first data line part 131 is opposed to the intermediate conductor 51 of the unit element P1 (i.e., the area of a region in which the side end (vertical side end of the substrate 10) of the intermediate conductor 51 is opposed to the side end of the first data line part 131). When the dimensions and distances of each part are selected as described above, the capacity value c2 can be set to be larger than the capacity value c1.

However, in order to precisely set the gate potential Vg of the drive transistor Tdr according to the data potential Vdata of the corresponding data line 13, it is desired that the capacity value c2 of the capacity Cb of any desired unit element P2 is smaller than the capacity value C of the capacitor element C1 of the unit element P2 (the synthetic capacity of the capacitor element C1 and the capacity Cs parasitic to the gate electrode 511). In order to satisfy this condition, for example, the space between the first data line part 131 and the corresponding power line 15 is set to be larger than the space between the electrodes E1 and E2 in the capacitor element C1. In further detail, the thickness of the first insulating layer L1 (i.e., the dielectric of the capacity Cb) interposed between the first data line part 131 and the corresponding power line 15 is set to be larger than the thickness of the gate insulating layer L0 (i.e., the dielectric of the capacitor element C1) interposed between the electrodes E1 and E2. Also, even when the area (i.e., the area of the capacitor element C1) in which the electrodes E1 and E2 are opposed to each other is larger than the area in which the first data line part 131 and the corresponding power line 15 are opposed to each other, the capacity value c2 of the capacity Cb is smaller than the capacity value C of the capacitor element C1.

As shouts in FIG. 4, the whole surface of the first insulating layer L1 on which the second data line parts 132 and the power lines 15 have been formed is covered with the second insulating layer L2. Referring to FIGS. 3 and 4, the first electrodes 21 are formed on the surface of the second insulating layer L2. Each of the first electrodes 21 is a substantially rectangular electrode overlapping the electrical continuity portion 71, the drive transistor Tdr, and the capacitor element C1 in the vertical direction to the substrate 10. In this embodiment, the first electrodes 21 are formed using a light-reflecting conductive material such as a metal, e.g., aluminum or silver, or an alloy composed of such a metal as a main component. Each of the first electrodes 21 is electrically conducted to the portion 712 of the electrical continuity portion 71 through a contact hole Ha8 passing through the second insulating layer L2. Namely, the drain region 311d of the drive transistor Tdr and the first electrode 21 of the light-emitting element E are electrically connected to each other through the electrical continuity portion 71.

In addition, partitions 25 are formed in a predetermined form (lattice) on the surface of the second insulating layer L2 on which the first electrodes 21 have been formed, for bounding the respective unit elements P. The partitions 25 function to electrically isolate between the adjacent first electrodes 21 (i.e., function to individually control the potentials of the respective first electrodes 21). The luminescent layer 23 of each light-emitting element E is formed in a recess having the first electrodes 21 at the bottom and surrounded by the inner peripheral surfaces of the partitions 25. In order to accelerate or make more efficient the light emission of the luminescent layer 23, various functional layers (e.g., a hole injection layer, a hole transport layer, an electron injection layer, an electron transport layer, a hole block layer, and an electron block layer) may be laminated on the luminescent layer 23.

As shown in FIG. 4, the second electrode 22 is continuously formed over a plurality of unit elements P to cover the luminescent layers 23 and the partitions 25. Therefore, the partitions 25 electrically isolate between the first and second electrodes 21 and 22 within the space between the respective light-emitting elements E. In other words, the partitions 25 define a region (i.e., actual emission region) in which a current flows between the first and second electrodes 21 and 22. The second electrode 22 is formed using a light-transmitting conductive material such as ITO (Indium Tin Oxide) or IZO (Indium Zinc Oxide). Therefore, the light emitted from the luminescent layer 23 toward the side opposite to the substrate 10 and the light emitted from the luminescent layer 23 toward the substrate side and reflected by the surface of the first electrodes 21 pass through the second electrode 22 and is then emitted. Namely, the light-emitting device D of this embodiment is a top-emission type.

The second electrode 22 is covered with a sealing material (not shown) over the entire region thereof. The sealing material has a structure including a first layer for protecting the second electrode 22, a second layer for planarizing the surface of the second electrode 22, and a third layer (barrier layer) for preventing the entrance of impurities (e.g., moisture) into the second electrode 22 and the luminescent layer 23, these layers being laminated in that order from the second electrode side.

As described above, in this embodiment, the electrical continuity portion 71 is disposed in a region opposite to the capacitor element C1 with the drive transistor Tdr provided therebetween. This configuration exhibits the effect of decreasing the required capacity value of the capacitor element C1. This effect will be described in detail below.

Figure 11:
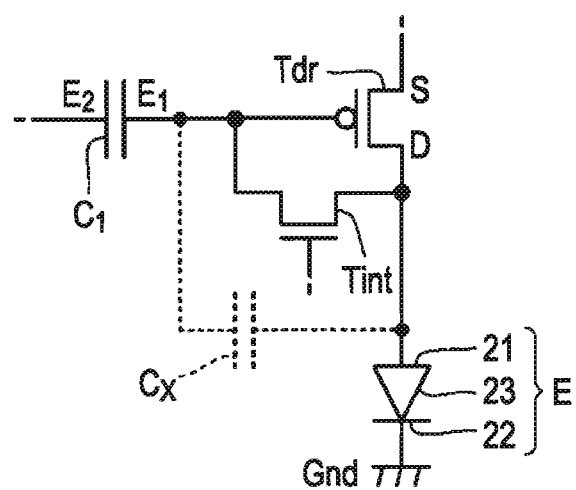
FIG. 11 is a circuit diagram illustrating the advantage of an embodiment of the invention.

Here, a configuration (referred to as "configuration 1" hereinafter) is assumed, in which the electrical continuity portion 71 is disposed in the space between the drive transistor Tdr and the capacitor element C1 in the Y direction of the substrate 10. In the configuration 1, the electrode E1 of the capacitor element C1 is brought near to the electrical continuity portion 71 with the first insulating layer L1 provided therebetween. Therefore, as shown by a broken line in FIG. 11, a capacity Cx is attached between the electrode E1 and the electrical continuity portion 71 (the first electrode 21).

During the write period, the potential of the electrode E1 is changed by $\Delta V \cdot C/(C+Cs)$. In the configuration 1, the capacity value Cs is increased by an amount corresponding to the capacity Cx, as compared with a case in which the electrode E1 and the electrical continuity portion 71 are not capacitively coupled. Thus, the variation of the gate potential Vg of the drive transistor Tdr with the variation $\Delta V$ of the potential of the corresponding data line 13 is limited. Therefore, in order to change the gate voltage Vg within a wade range according to the variation $\Delta V$ (i.e., in order to sufficiently secure the range of the quantity of light of the light-emitting element E), the sufficient capacity value C of the capacitor element C1 is preferably secured by a method of decreasing the thickness of the gate insulating layer L0 or increasing the area of the electrodes E1 and E2. Since the decrease in the thickness of the gate insulating layer L0 is limited, in the configuration 1, the area of the electrodes E1 and E2 is preferably increased. However, when the area of the capacitor element C1 is increased, there is the problem of limiting the achievement of higher-definition unit elements P.

On the other hand, in this embodiment, the electrical continuity portion 71 is disposed in the region opposite to the capacitor element C1 with the drive transistor Tdr provided therebetween. Therefore, the capacity Cx attached to the electrode E1 and the electron conducting part 71 is sufficiently decreased, as compared with the configuration 1. Therefore, even if the area of the capacitor element C1 is not so much increased as in the configuration 1, the gate potential Vg (the quantity of light of the light-emitting element E) of the gate electrode 511 of the drive transistor Tdr can be widely changed.

In this embodiment, the electrical continuity portion 71 and the connecting portion 61 which are formed using the same layer as the power lines 15 are located on the negative side (one of the sides of the corresponding power line 15 in the width direction) of the drive transistor Tdr in the Y direction. In this configuration, in the surface of the first insulating layer L1, a space can be sufficiently secured for forming the corresponding power line 15 on the positive side (the other side of the corresponding power line 15 in the width direction) of the drive transistor Tdr in the Y direction. There is thus the effect that the corresponding power line 15 can be widely formed to decrease the resistance. In particular, in this embodiment, each of the power lines 15 is formed to overlap the capacitor elements C1, and thus the resistance of the power lines 15 is significantly decreased, as compared with a case in which each of the power lines 15 is formed to overlap only the source regions 31s of the drive transistors Tdr. The decrease in resistance suppresses a voltage drop in the plane of each power line 15, thereby decreasing variations in the power potential Vdd supplied to each unit element P and variations in quantity of light of each light-emitting element E due to the variations in the power potential Vdd.

For example, in a configuration in which the electrical continuity portion 71 and the connecting portion 61 are disposed in the space between the drive transistor Tdr and the capacitor element C1, the corresponding power line 15 is preferably formed to avoid the electrical continuity portion 71 and the connecting portion 61. However, when the shape of the power lines 15 is complicated as described above, there is the problem of easily producing disconnection or failure in the power lines 15 for the reason of manufacturing technology. However, in this embodiment, the space for each power line 15 is secured on the side opposite to the electrical continuity portion 71 and the connecting portion 61 with the drive transistor Tdr provided therebetween. Therefore, as illustrated in FIG. 7, each of the power lines 15 can be formed in a simple linear shape. As a result, the disconnection or failure of the power lines 15 is suppressed, thereby improving the yield of the light-emitting device D according to this embodiment.

Only from the viewpoint of reduction in the resistance of the power lines 15, each of the power lines 15 may be formed to overlap not only the drive transistor Tdr and the capacitor element C1 but also the selection transistor Tsl and the initialization transistor Tint (referred to as a "configuration 2" hereinafter). However, the configuration 2 has the problem of easily producing dullness in the waveform of the selection signal Sa due to capacity coupling between the selection transistor Tsl or the corresponding selection line 11 and the corresponding power line 15 (i.e., a capacity parasitic between both). Similarly, the capacity attached between the initialization transistor Tint or the corresponding initialization line 12 and the corresponding power line 15 may cause dullness in the waveform of the initialization signal Sb.

Therefore, the configuration 2 has the problem of delaying switching of the selection transistor Tsl and the initialization transistor Tint.

However, in this embodiment, each of the power lines 15 does not overlap the selection transistor Tsl or the corresponding selection line 11 and the initialization transistor Tint or the corresponding initialization line 12 in the vertical direction to the substrate 10. Therefore, the capacity parasitic between the components and the corresponding power line 15 is decreased as compared with the configuration 2. In this embodiment, consequently, dullness in the waveforms of the selection signal Sa and the initialization signal Sb are suppressed to permit high-speed operations of the selection transistor Tsl and the initialization transistor Tint.

<B-2: Second Embodiment>

Next, the specific configuration of each unit element P according to a second embodiment of the invention will be described. FIG. 12 is a plan view showing the configuration of a unit element P in this embodiment, and FIGS. 13 to 15 are plan views showing the surface of a substrate 10 in respective steps for forming the unit element P. In the description below, a component common to the first embodiment is denoted by the same reference numeral, and the description thereof is appropriately omitted.

As shown in FIG. 13, a semiconductor layer 32, a semiconductor layer 42, and a semiconductor layer 45 are formed on the surface of the substrate 10 using the same layer composed of a semiconductor material. The semiconductor layer 32 is a substantially rectangular part constituting the drive transistor Tdr. The semiconductor layer 42 is formed on the positive side in the Y direction as seen from the semiconductor layer 32 and includes the substantially rectangular electrode E2 and an element part 421 extending from the lower left portion of the electrode E2 in the X direction. The element part 421 functions as a semiconductor layer of the selection transistor Tsl. The semiconductor layer 45 constitutes the initialization transistor Tint and extends in the X direction in a region opposite to the semiconductor layer 32 with the semiconductor layer 42 provided therebetween.

The surface of the substrate 10 on which the above-mentioned components have been formed is covered with the gate insulating layer L0. As shown in FIG. 14, the first data line part 131, the corresponding selection line 11, the corresponding initialization line 12, an intermediate conductor 52, and a first relay wiring part 171 are formed on the surface of the gate insulating layer L0 using the same layer. Like in the first embodiment, the first data line part 131 constitutes the corresponding data line 13 and extends in the Y direction in a region on the positive side in the X direction as seen from the intermediate conductor 52.

The initialization line 12 includes a first gate electrode 121 and a second gate electrode 122 which are branched from a portion extending in the X direction to the negative side in the Y direction and overlap the semiconductor layer 45. In the semiconductor layer 45, the portion overlapping each of the first gate electrode 121 and the second gate electrode 122 severs as a channel region of the initialization transistor Tint. Similarly, the selection line 11 includes a first gate electrode 111 and a second gate electrode 112 which are branched to the negative side in the Y direction from a portion extending in the X direction and overlap the element part 421 of the semiconductor layer 42. The first gate electrode 111 and the second gate electrode 112 are adjacent to each other with a space therebetween in the X direction. In the element part 421, a portion overlapping each of the first gate electrode 111 and the second gate electrode 112 with the gate insulating layer L0 provided therebetween serves as a channel region of the selection transistor Tsl. As described above, in this embodiment, each of the selection transistor Tsl and the initialization transistor Tint is a dual-gate structure thin-film transistor.

The intermediate conductor 52 includes an electrode E1 constituting the capacitor element C1 and opposed to the electrode E2, a gate electrode 521 continuing from the electrode E1 to the negative side in the Y direction, and a connecting portion 523 projecting from a substantially central portion of the electrode E1 in the X direction to the positive side in the Y direction. The gate electrode 521 extends in the Y direction over the entire dimension of the semiconductor layer 32 in the Y direction so as to overlap the semiconductor layer 32. As shown in FIG. 14, in the semiconductor layer 32, a region overlapping the gate electrode 521 with the gate insulating layer L0 provided therebetween serves as a channel region 32c of the drive transistor Tdr, Also, a region on the negative side in the X direction with the channel region 32c provided therebetween serves as a drain region 32d, and the opposite region serves as a source region 32s.

The first relay wiring part 171 constitutes wiring (referred to as "relay wiring" hereinafter) for electrically connecting the initialization transistor Tint and the drain region 32d of the drive transistor Tdr, and extends in the Y direction in a region on the negative side in the X direction as seen from the intermediate conductor 52. Namely, in this embodiment, the intermediate conductor 52 is disposed in the space between the first data line part 131 and the first relay wiring part 171.

The surface of the gate insulating layer L0 on which the above-described components have been formed is covered with the first insulating layer L1 over the entire region thereof. As shown in FIGS. 12 and 15, a second data line part 132, a connecting portion 62, a second relay wiring part 172, and an electrical continuity portion 72, and the corresponding power line 15 are formed on the surface of the first insulating layer L1.

Like in the first embodiment, the second data line part 132 is wiring constituting the corresponding data line 13 together with the first data line part 131. Namely, the second data line part 132 extends in the Y direction from the end 132a electrically conducted to the upper end 131a (refer to FIG. 14) of the first data line part 131 through a contact hole Hb1 and reaches the end 132b. The end 132b is electrically conducted to the lower end 131b (refer to FIG. 14) of the first data line part 131 through a contact hole Hb2. In this embodiment, the second data line part 132 is electrically conducted to the end of the element part 421 through a contact hole Hb3 passing through the first insulating layer L1 and the gate insulating layer L0. Namely, the selection transistor Tsl is electrically connected to the corresponding data line 13 though the contact hole Hb3.

As shown in FIGS. 14 and 15, the connecting portion 62 extends in the Y direction to overlap the connecting portion 523 of the intermediate conductor 52 and the end 451 of the semiconductor layer 45 on the positive side in the X direction. The connecting portion 62 is electrically conducted to the connecting portion 523 (the electrode E1 and the gate electrode 521) through a contact hole Hb4 passing through the first insulating layer L1 and also to the end 451 of the semiconductor layer 45 through a contact hole Hb5 passing through the first insulating layer L1 and the gate insulating layer L0. Namely, the electrode E1 (the gate electrode 521 of the drive transistor Tdr) of the capacitor element C1 is electrically connected to the initialization transistor Tint through the connecting portion 62.

As shown in FIG. 15, the connecting portion 62 is located in a region between the first gate electrode 111 and the second gate electrode 112 of the selection transistor Tsl in the X direction of the substrate 10. Therefore, the connecting portion 62 does not overlap the first gate electrode 111 and the second gate electrode 112. In a configuration in which the first gate electrode 111 (or the second gate electrode 112) overlaps the connecting portion 52, both are capacitively coupled. Hence, the potential of the first gate electrode 111 varies with variations in the potential of the connecting portion 62 (i.e., the potentials of the electrode E1 and the gate electrode 511 of the drive transistor Tdr). As a result, the waveform of the initialization signal Sb may become dull, resulting in a delay of the operation of the initialization transistor Tint.

On the other hand, in this embodiment, the connecting portion 62 is formed so as not to overlap the first gate electrode 111 and the second gate electrode 112, and thus capacity coupling between the connecting portion 62 and the first and second gate electrodes 111 and 112 is suppressed. Therefore, the influence of a variation in the potential of the connecting portion 62 on the initialization transistor Tint is decreased, resulting in the high-speed operation of the initialization transistor Tint.

In the above-described configuration in which the initialization transistor Tint is conduced to the electrode E1 of the capacitor element C1 through the connecting portion 62, the sufficient channel lengths of the selection transistor Tsl and the initialization transistor Tint can be secured. Therefore, it is possible to suppress current leakage in the selection transistor Tsl and the initialization transistor Tint, in comparison to a configuration in which the channel lengths are limited. Since the selection transistor Tsl and the initialization transistor Tint are connected to the gate electrode 521 of the drive transistor Tdr, variation in the potential of the gate electrode 521 during the drive period is suppressed by a decrease in current leakage in each of the transistors. Therefore, in this embodiment, the quantity of light of the light-emitting element E can be precisely maintained at a desired value.

Like the electrical continuity portion 71 of the first embodiment, the electrical continuity portion 72 shown in FIG. 15 is interposed between the drain electrode of the drive transistor Tdr and the first electrode 21 of the light-emitting element E, for electrically connecting both. The electrical continuity portion 72 has a shape (substantially L-shaped) including a portion 721 extending in the Y direction and a portion 722 located opposite to the capacitor element C1 with the drive transistor Tdr provided therebetween, both portions being connected to each other. The portion 721 overlaps the end 171a (refer to FIG. 14) of the first relay wiring part 171 and the drain region 32d of the semiconductor layer 32. The portion 721 is electrically conducted to the upper end 171a through a contact hole Hb6 passing through the first insulating layer L1.

In the first insulating layer L1, a plurality (two in this embodiment) of contact holes Hb7 is formed in a region overlapping the drain region 32d so as to pass through the first insulating layer L1 and the gate insulating layer L0. These contact holes Hb7 are arrayed in the direction of extension of the gate electrode 521 along the Y direction (i.e., the direction of the channel width of the drive transistor Tdr). The portion 721 of the electrical continuity portion 72 is electrically conducted to the drain region 32d through the contact holes Hb7.

As shown in FIGS. 14 and 15, the second relay wiring part 172 is wiring extending in the Y direction so as to overlap the end 452 of the semiconductor layer 45 on the negative side in the X direction and the first relay wiring part 171. The second relay wiring part 172 is electrically conducted to the end 452 through a contact hole Hb8 passing through the first insulating layer L1 and the gate insulating layer L0 and also to the lower end 171b of the first relay wiring part 171 through a contact hole Hb9 passing through the first insulating layer L1.

As described above, the initialization transistor Tint is electrically connected to the drain region 32d (furthermore, the electrical continuity portion 72) of the drive transistor Tdr through the relay wiring 17 including the first relay wiring part 171 and the second relay wiring part 172.

Figure 16:
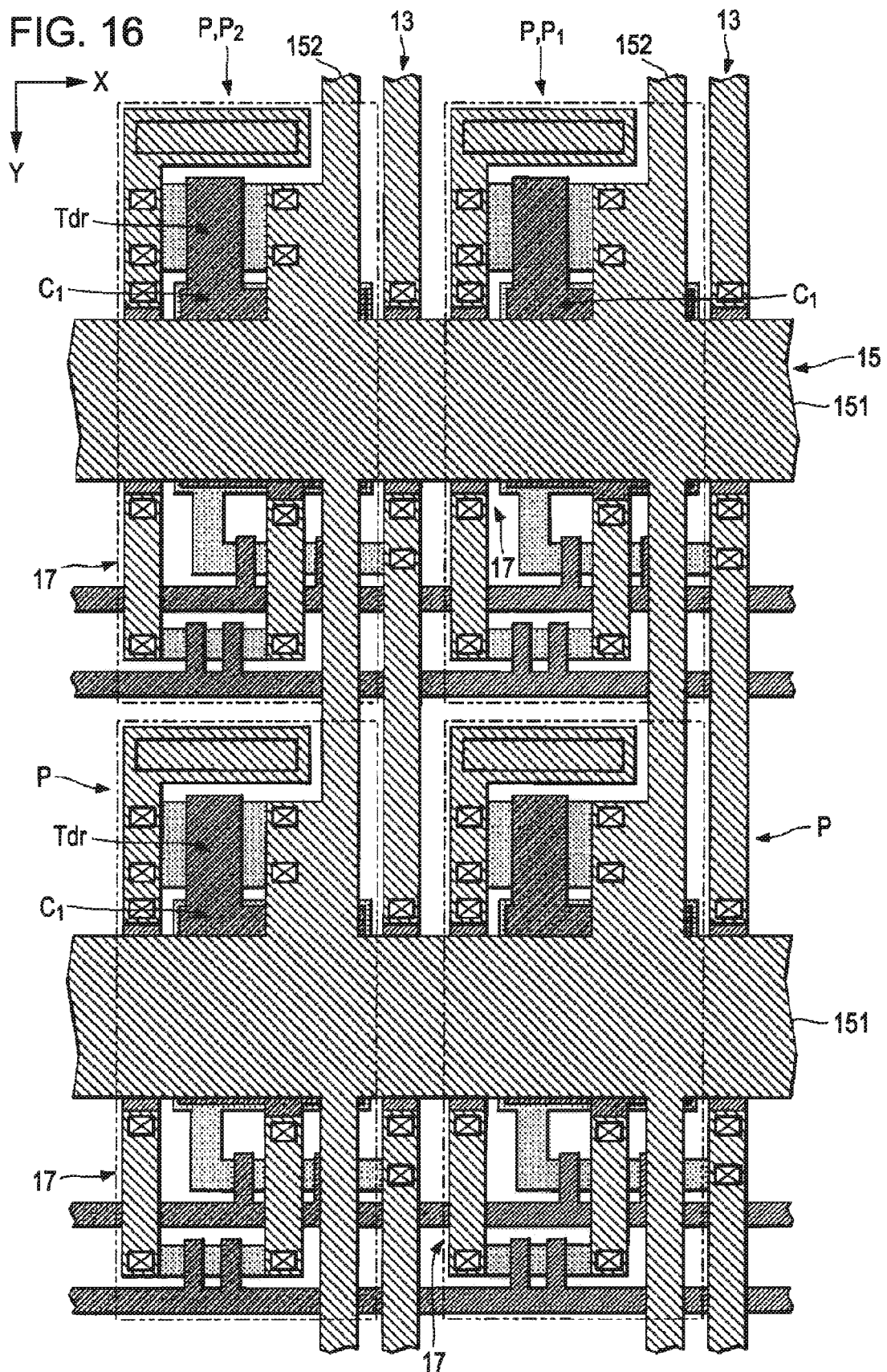
FIG. 16 is a plan view showing a plurality of unit elements in the step of forming the second insulating layer.

FIG. 16 is a plan view showing an array of four unit elements P, which are in the step shown in FIG. 15, in the X and Y directions. As shown in FIGS. 15 and 16, in this embodiment, each of the power lines 15 includes a first portion 151 extending in the X direction over a plurality of unit elements P and a second portion 152 extending in the Y direction over a plurality of unit elements P, both portions 151 and 152 intersecting to form wiring (lattice form).

As shown in FIG. 15, in the first insulting layer L1, a plurality (two in this embodiment) of contact holes Hb10 is formed in a region overlapping the source region 32s of the semiconductor layer 32 so as to pass through the first insulating layer L1 and the gate insulating layer L0. The contact holes Hb10 are arrayed in the direction of extension of the gate electrode 521 along the Y direction. Each of the power lines 15 (second portion 152) is electrically conducted to the source region 32s through the contact holes Hb10.

The first portion 151 extends in the X direction so as to pass through the spaces between the respective second data line parts 132 and the spaces between the second relay wiring parts 172 and the electrical continuity portions 72 (portion 721). Therefore, as shown in FIGS. 15 and 16, each of the first portions 151 overlaps the first data line parts 131, the first relay wiring parts 171, and the capacitor elements C1 in the vertical direction to the substrate 10. In addition, each of the second portions 152 extends in the Y direction so as to pass through the spaces between the electrical continuity portions 72 (portions 722) and the second data line parts 132 and the spaces between the connecting portions 62 and the second data line parts 132. As shown in FIGS. 15 and 16, each of the power lines 15 does not overlap the selection transistor Ts and the initialization transistor Tint.

The surface of the first insulating layer L1 on which the above-described components have been formed is covered with the second insulating layer L2 over the entire region. As shown in FIG. 12, the partitions 25 defining the light-emitting elements E and the spaces therebetween are formed on the surface of the second insulating layer L2. Like in the first embodiment, the portion 722 of the electrical continuity portion 72 is electrically conducted to the first electrode 21 through a contact hole Hb11 passing through the second insulating layer L2. As shown in FIG. 12, the specific configuration of the light-emitting element E and the partitions 25 is the same as in the first embodiment.

As described above, in this embodiment, the electrical continuity portion 72 is disposed opposite to the capacitor element C1 with the drive transistor Tdr provided therebetween. Therefore, like in the first embodiment, a capacity (the capacity Cx shown in FIG. 11) parasitic to the electrode E1 and the electrical continuity portion 72 is reduced. Also, each of the power lines 15 is formed so as not to overlap the selection transistors Tsl and the initialization transistors Tint, and thus, like in the first embodiment, the selection transistor Tsl and the initialization transistor Tint can be operated at a high speed with predetermined timing.

In this embodiment, the electrical continuity portion 72, the connecting portion 62, and the second relay wiring part 172 are formed using the same layer as the power lines 15. Also, the electrical continuity portion 72 is disposed on the negative side (i.e., one of the sides of the corresponding power line 15 in the width direction) in the X direction with the drive transistor provided therebetween, and the connecting portion 62 and the second relay wiring part 172 are disposed on the opposite side (the other side of the corresponding power line 15 in the width direction). Therefore, it is possible to secure a sufficient space between the electrical continuity portion 72 and the connecting portion 62 (the second relay wiring part 172), for forming the first portion 151 of the corresponding power line 15, which extends in the X direction. Furthermore, the space overlapping the capacitor element C1 in the vertical direction to the substrate 1 can be used for forming the corresponding power line 15. Therefore, like in the first embodiment, the power lines (the first portions 151) can be widely formed to exhibit the effect of decreasing the resistance.

In addition, in this embodiment, each second portion 152 extending in the Y direction connects the respective first portions 151, thereby further decreasing the resistance of the power lines 15 as compared with a case in which each of the power lines 15 includes only the first portion 151. Furthermore, the first portion 151 of each power line 15 is formed in a simple tripe shape, thereby suppressing the disconnection or failure of the power lines 15 as compared with a configuration in which the power lines 15 are formed in a complicated shape, avoiding the components (the electrical continuity portions 72 and the connecting portions 62) formed using the same layer as the power lines 15.

In this embodiment, in each of the unit elements P, the data line 13 extends along the edge on the positive side in the X direction, and the relay wiring 17 extends along the edge on the negative side in the X direction. In this configuration, for example, attention is given to one unit element P1 and the other unit element P2 adjacent thereto on the negative side in the X direction, as shown in FIG. 16. The relay wiring 17 for the unit element P1 is interposed between the capacitor element C1 of the unit element P1 and the data line corresponding to the unit element P2. Therefore, a capacity parasitic between the capacitor element C1 of the unit element P1 and the data line corresponding to the unit element P2 is decreased, as compared with the configuration of the first embodiment in which the capacitor element C1 of one unit element P comes close to the data line 13 corresponding to the unit element P adjacent thereto. In this configuration, the influence of a variation in potential of the data line 13 corresponding to the unit element P2 on the capacitor element C1 of the unit element P1 is decreased. As a result, the gate potential Vg of the drive transistor Tdr of each unit element P and the quantity of light of each light-emitting element E according to the gate potential Vg can be precisely set to desired values.

<Modified Example of Second Embodiment>

Next, a modified example of the above-described second embodiment will be described. FIG. 17 is a plan view showing the step (the step shown in FIG. 14) of forming the first insulating layer L1 in this modified example. In the second embodiment, the gate electrode 521 of the drive transistor Tdr extends in the Y direction. However, in the modified example, as shown in FIG. 17, the gate electrode 521 extends in the X direction. In the modified example, the same components as in the second embodiment are denoted by the same reference numerals, and the description thereof is appropriately omitted.

As shown in FIG. 17, in this embodiment, the intermediate conductor 52 includes a connecting portion 525 extending from the upper left part of the electrode E1, to the negative side in the Y direction and a gate electrode 521 extending from the connecting portion 525 in the X direction and overlapping the semiconductor layer 32. The gate electrode 521 extends over the whole size of the gate insulating layer L0 in the X direction. In the semiconductor layer 32, a region opposed to the gate electrode 521 with the gate insulating layer L0 provided therebetween serves as a channel region 32c of the drive transistor Tdr. Also, a region on the electrode E1 side with the channel region 32c provided therebetween serves as a source region 32s, and the opposite region servers as a drain region 32d.

FIG. 18 is a plan view showing the step (the step shown in FIG. 15) of forming the power line 15 and the electrical continuity portion 72 after the step shown in FIG. 17. As shown in FIG. 18, the electrical continuity portion 72 is formed in a substantially rectangular shape in a region opposite to the capacitor element C1 with the drive transistor Tdr provided therebetween. As shown in FIGS. 17 and 18, the electrical continuity portion 72 is electrically conducted to the drain region 32d through a plurality of contact holes Hb7 arrayed in the direction of extension of the gate electrode 521 along the X direction (i.e., the direction of the channel length of the drive transistor Tdr). The corresponding power line 15 is electrically conducted to the source region 32s through a plurality of contact holes Hb10 arrayed in the X direction along the gate electrode 521.

As described above, the gate electrode 521 of the drive transistor Tdr extends in the X direction, and thus the drain region 32d is formed in an elongated shape along the X direction in the region opposite to the capacitor element C1 with the gate electrode 521 provide therebetween. In this configuration, a portion (the portion 721 of the first embodiment) extending in the Y direction along the drive transistor Tdr need not be formed in the electrical continuity portion 72. Therefore, it is understood from comparison between FIGS. 18 and 15 that this modified example has the advantage of permitting the formation of a wider first portion 151 of each power line 15, which extends in the direction of extension of the gate electrode 521, as compared with the second embodiment.

Furthermore, in the modified example, the contact holes Hb7, the contact holes Hb6 (portion of conduction between the relay wiring 17 and the electrical continuity portion 72), and the contact holes Hb1 (portion of conduction between the first and second data line parts 131 and 132) are linearly arrayed along the X direction. Therefore, the width of the first portion 151 (stripe shape) linearly extending in the X direction can be sufficiently secured, as compared with a configuration in which the positions of the contact holes (Hb7, Hb6, and Hb1) deviate in the Y direction.

In the second embodiment, the gate electrode 521 extends in the direction perpendicular to the first portion 151 of each power line 15, Thus, as the length of the gate electrode 521 (strictly, the length of the portion 721 of the electrical continuity portion 72) increases, the width of the first portion 151 decreases. However, in the modified example, the gate electrode 521 extends in parallel to the first portion 151, and thus the length of the gate electrode 521 can be increased without decreasing the width of the first portion 151. Since the length of the gate electrode 521 corresponds to the channel width of the drive transistor Tdr, in the modified example, the channel width of the drive transistor Tdr can be increased while maintaining the width of the first portion 151. In this way, the drive transistor Tdr having a wider channel width has the advantage that the quantity of the current supplied to each light-emitting element E through the drive transistor Tdr can be sufficiently secured.

<B-3: Third Embodiment>

Next, the specific configuration of a unit element P according to a third embodiment of the invention will be described. FIG. 19 is a plan view showing the configuration of a unit element P of this embodiment, and FIGS. 20 to 22 are plan views showing the surface of a substrate 10 in respective steps for forming a unit element P.

As shown in FIG. 20, a semiconductor layer 33 and a semiconductor layer 43 are formed on the surface of the substrate 10 using the same layer composed of a semiconductor material. The shape of the semiconductor layer 33 is the same as the semiconductor layer 31 of the first embodiment. The semiconductor layer 43 includes a substantially rectangular electrode E2 constituting the capacitor element C1 and an element part 431 connected to the electrode E2. The element part 431 functions as a semiconductor layer of the selection transistor Tsl and includes a portion 431a extending from the lower right portion of the electrode E2 to the positive side in the Y direction, a portion 431b extending from the portion 431a to the positive side in the X direction, and a portion 431c extending from the end of the portion 431b to the negative side in the Y direction.

Figure 21:
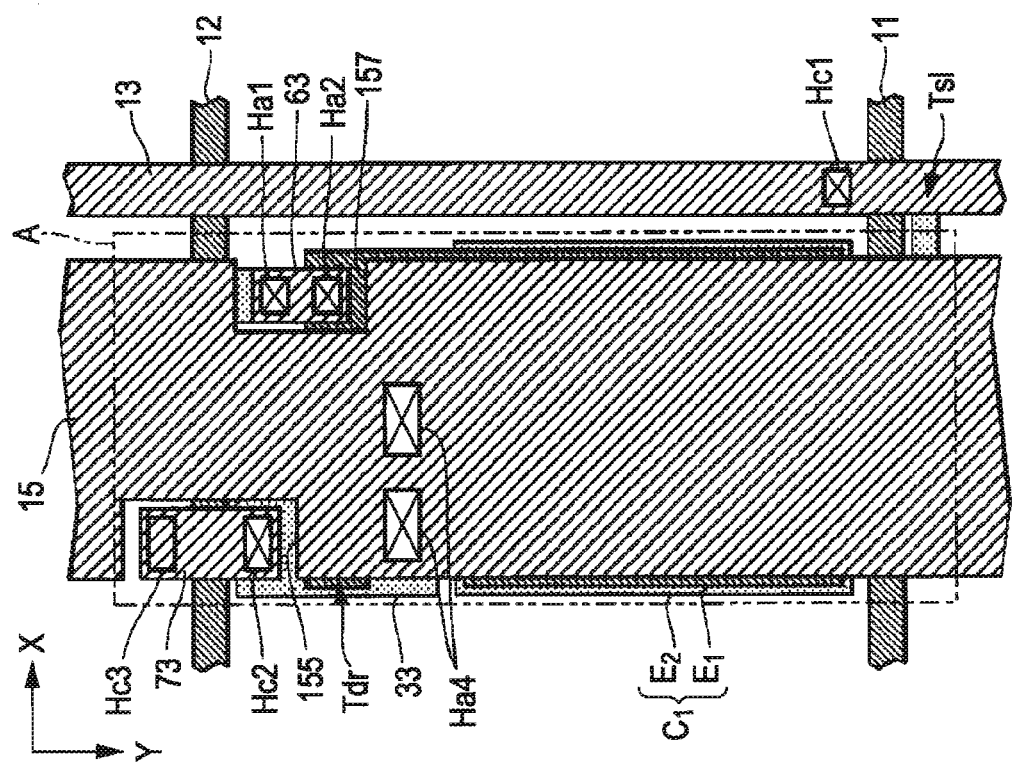
FIG. 21 is a plan view showing the step of forming a first insulating layer.

As shown in FIG. 21, intermediate conductors 53, the selection lines 11, and the initialization lines 12 are formed using the same layer on the gate insulating layer L0 covering the semiconductor layer 33 and the semiconductor layer 43. The shapes of the intermediate conductors 53 and the initialization lines 12 and the relations to other components are the same as the intermediate conductors 51 and the initialization lines 12 of the first embodiment. Each of the selection lines 11 extends in the X direction to overlap the element parts 431 of the semiconductor layers 43 in the vertical direction to the substrate 10. In each of the portions 431a and 431c of the element part 431, a portion overlapping the corresponding selection line 11 serves as a channel region of the selection transistor Tsl. Namely, in this embodiment, the selection transistor Tsl has a dual gate structure.

Figure 22:
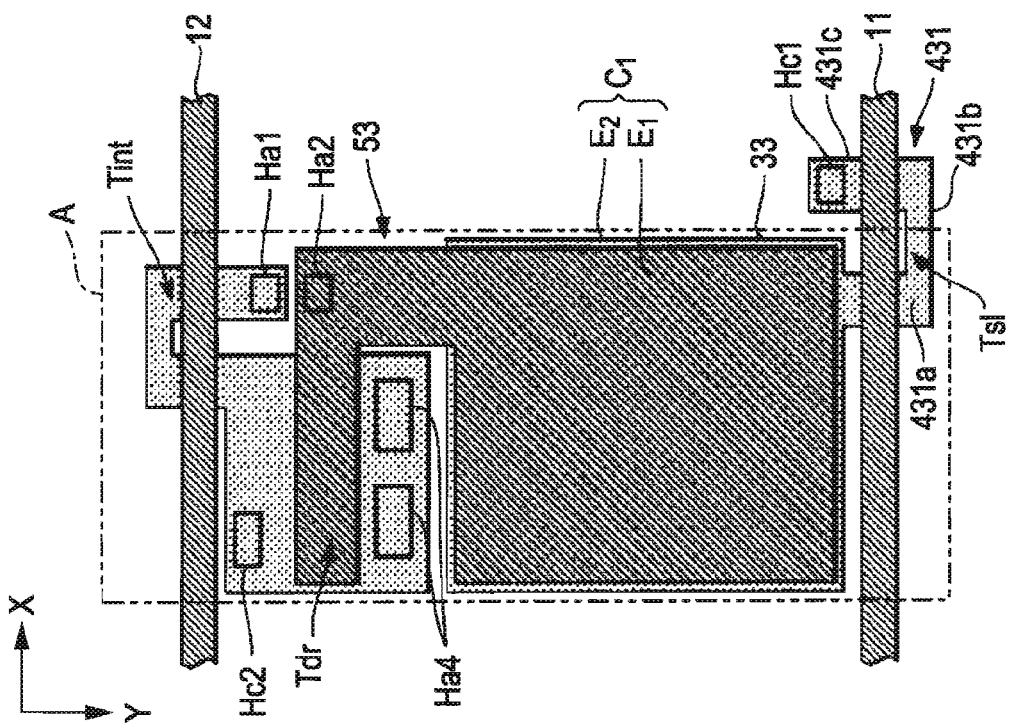
FIG. 22 is a plan view showing the step of forming a second insulating layer.

As shown in FIG. 22, a connecting portion 63, a electrical continuity portion 73, and the corresponding data line 13 and power line 15 are formed using the same layer on the surface of the first insulating layer L1 covering the intermediate conductors 53, the selection lines 11, and the initialization lines 12. The shape of the connecting portions 63 and relations to other components are the same as the connecting portions 61 of the first embodiment. Each of the data lines 13 is wiring extending in the Y direction in a region on the positive side in the X direction as seen from the drive transistor Tdr and the capacitor element C1 and is electrically conducted to the element part 431 (portion 431c) of the semiconductor layer 43 through a contact hole Hc1.

The electrical continuity portion 73 is a substantially rectangular part formed in a region opposite to the capacitor element C1 with the drive transistor Tdr provided therebetween and is electrically conducted to the semiconductor layer 33 (drain region of the drive transistor Tdr) through a contact hole Hc2, As shown in FIGS. 19 and 22, the first electrode 21 of the light-emitting element E is electrically conducted to the electrical continuity portion 73 through a contact hole Hc3 passing through the second insulating layer L2.

Figure 23:
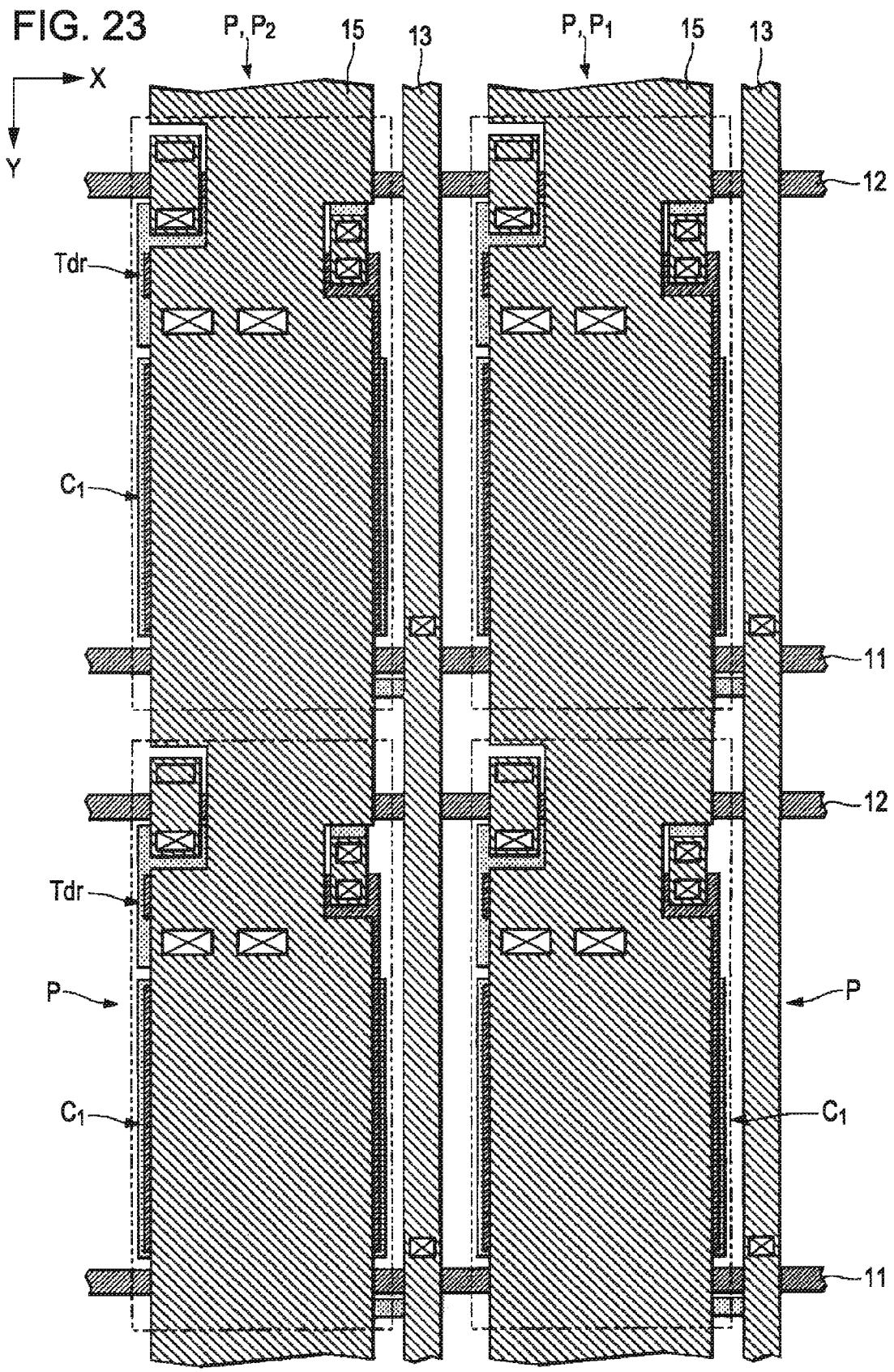
FIG. 23 is a plan view showing a plurality of unit elements in the step of forming the second insulating layer.

FIG. 23 is a plan view showing an array of four unit elements P in the step shown in FIG. 22 in the X and Y directions. As shown in FIGS. 22 and 23, in this embodiment, each of the power lines 15 extends in the Y direction to overlap the drive transistor Tdr and the capacitor element C1 of each unit element P in the vertical direction to the substrate 10. Like in the first embodiment, each of the power lines 15 is electrically conducted to the semiconductor layer 33 (source region of the drive transistor Tdr) through contact holes Ha4. As shown in FIG. 22, a notch portion 155 is formed at the edge of each power line 15 on the negative side in the X direction avoid each electrical continuity portion 73, and a notch portion 157 is formed at the edge on the positive side in the X direction to avoid each connecting portion 63.

As shown in FIG. 23, one unit element P1 and the other unit element P2 adjacent thereto on the negative side in the X direction are considered. In this embodiment, as described in the first embodiment with reference to FIG. 11, the distance between the data line 13 and the power line 15 (thickness of the fist insulating layer L1) and the space between the intermediate conductor 53 of the unit element P1 and the data line 13 corresponding to the unit element P2 are selected so that the capacity value c1 of the capacity Ca attached between the element E11 (intermediate conductor 53) of the unit element P1 and the data line 13 corresponding to the unit element P2 is smaller than the capacity value c2 of the capacity Cb attached between the data line 13 and the power line 15 corresponding to the unit element P2 ($c1<c2$). In this configuration, like in the first embodiment, the influence of a variation in potential of the data line 13 corresponding to the unit element P2 on the potential of the capacitor element C1 of the unit element P1 can be decreased.

In this embodiment, the electrical continuity portion 73 is disposed opposite to the capacitor element C1 with the drive transistor Tdr provided therebetween. Like in the first embodiment, therefore, capacity coupling (the parasitic capacity Cx shown in FIG. 11) between the electrode E1 and the electrical continuity portion 73 is suppressed. Therefore, it is possible to decrease the capacity of the capacitor element C1 (furthermore, decreasing the area). In the first and second embodiments, the first data line part 131 and the second data line part 132 are connected together to form each data line 13. However, in this embodiment, each of the data lines 13 includes a single conductor film, thereby exhibiting the advantage of decreasing the resistance of the data lines 13 and disconnection thereof in comparison to the first and second embodiments.

<C: Modified Example>

There are various modifications of the above-described embodiments. Examples of modifications include the following. The modifications below may be appropriately combined.

<C-1: Modified Example 1>

In each of the above embodiments, the electric configuration of each unit element P may be appropriately changed. Examples of the unit element P used in the invention are given below.

Figure 24:
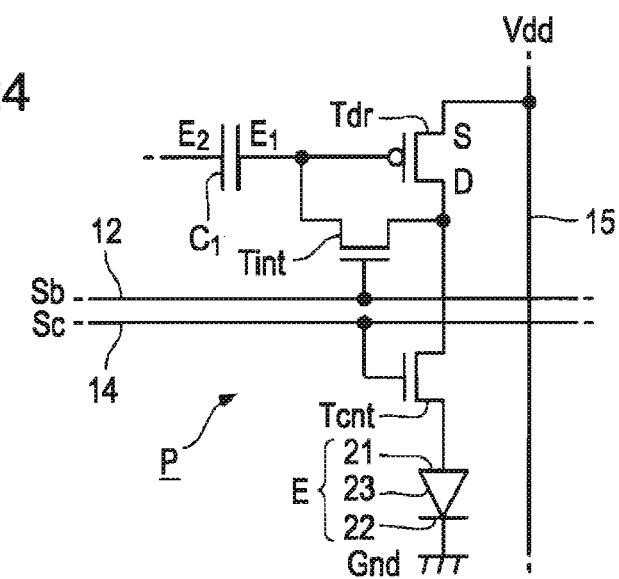
FIG. 24 is a circuit diagram showing the configuration of a unit element according to a modified example.

(1) As shown in FIG. 24, a transistor (referred to as an "emission control transistor" hereinafter) Tcnt may be interposed between the drive transistor Tdr and the light-emitting element E. The emission control transistor Tcnt includes a switching element for controlling the electric connection between the drain electrode of the drive transistor Tdr and the first electrode 21 of the light-emitting element E according to an emission control signal Sc supplied to a corresponding emission control line 14. When the emission control transistor Tcnt is turned on, a current path extending from the corresponding power line 15 to the light-emitting element E is formed to permit light emission of the light-emitting element E. While when the emission control transistor Tcnt is turned off, the path is cut off to inhibit the light emission of the light-emitting element E. Therefore, in this configuration, the emission control transistor Tcnt is turned on to emit light from the light-emitting element E only during the drive period except the initialization period and the write period. In this way, the actual emission period of the light-emitting element E can be precisely determined.

In each of the first to third embodiments, for example, the emission control transistor Tcnt is disposed opposite (on the negative side in the Y direction) to the capacitor element C1 with the drive transistor Tdr provided therebetween. In this case, there is the advantage that each of the power lines 15 can be widely formed to overlap both the drive transistor Tdr and the capacitor element C1, as compared with a case in which the emission control transistor Tcnt is disposed in the space between the drive transistor Tdr and the capacitor element C1.

Figure 25:
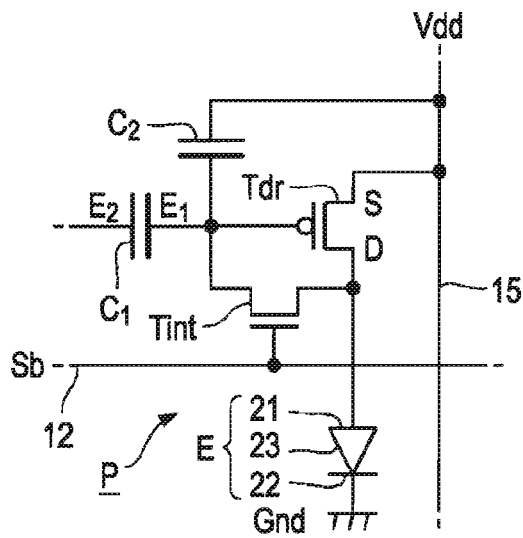
FIG. 25 is a circuit diagram showing the configuration of a unit element according to another modified example.

(2) As shown in FIG. 25, a capacitor element C2 may be interposed between the gate electrode and the source electrode (the corresponding power line 15) of the drive transistor Tdr. This configuration has the advantage in that the gate potential Vg of the drive transistor Tdr set in the write period can be maintained in the capacitor element C2 during the drive period. In a configuration in which the area (area of the channel region) of the drive transistor Tdr is sufficiently secured, the gate potential Vg is held by the gate capacitor of the drive transistor Tdr. Therefore, even in the first to third embodiments in which the capacitor element C2 is not disposed, the gate potential Vg can be held during the drive period.

Figure 26:
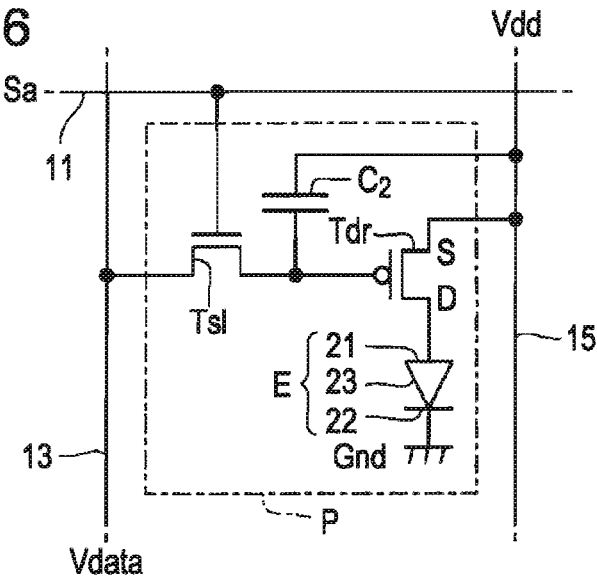
FIG. 26 is a circuit diagram showing the configuration of a unit element according to a further modified example.

(3) A unit element P having the configuration shown in FIG. 26 may be used. In this unit element P, the capacitor element C1 and the initialization transistor Tint (initialization line 12), which are provided in each of the above embodiments, are not formed so that the electric connection between the gate electrode of the drive transistor Tdr and the corresponding data line 13 is controlled by the selection transistor Tsl. Also, the capacitor element C2 is interposed between the gate electrode and source electrode (the corresponding power line 15) of the drive transistor Tdr.

In this configuration, when the selection transistor Tsl is turned on, the data potential Vdata corresponding to the gradation specified in the light-emitting element E is supplied to the gate electrode of the drive transistor Tdr from the corresponding data line 13 through the selection transistor Tsl. At the same time, a charge corresponding to the data potential Vdata is stored in the capacitor element C2, and thus the gate potential Vg of the drive transistor Tdr is kept at the data potential Vdata even when the selection transistor Tsl is turned off. Therefore, a current (corresponding to the data potential Vdata) corresponding to the gate potential Vg of the drive transistor Tdr is continuously supplied to the light-emitting element E. The supply of the current causes emission from the light-emitting element E with luminance corresponding to the data potential Vdata.

For example, the capacitor element C2 shown in FIG. 26 is disposed on the surface of the substrate 10 in the same manner as the capacitor element C1 in each of the above embodiments. In this embodiment, the same operation and advantage as in the first to third embodiments are exhibited. As described above, the capacitor element connected to the gate electrode of the drive transistor Tdr may be the capacitor element C1 for setting the gate potential Vg of the drive transistor Tdr by capacitor coupling or the capacitor element C2 for holding the data potential Vdata supplied to the gate electrode of the drive transistor Tdr from the corresponding data line 13.

<C-2: Modified Example 2>

Although, in the above-described embodiments, the first electrode 21 is composed of a light-reflecting material, the light emitted from the luminescent layer 23 toward the substrate 10 may be reflected by a reflecting layer other than the first electrode 21 toward the side opposite to the substrate 10. In this configuration, a reflecting layer composed of a light-reflecting material is formed on the surface of the first insulating layer L1, and the first electrode 21 is formed to cover the reflecting layer. In this case, the first electrode 21 is composed of a light-transmitting conductive material such as ITO or IZO. Furthermore, in the above-described embodiments, the second electrode 22 is composed of a light-transmitting material. However, even when the second electrode 22 is a very thin electrode composed of a light-shielding or reflecting conductive material, the light emitted from the luminescent layer 23 can be transmitted.

Of course, the present invention may be applied to a bottom-emission-type light-emitting device in which the light emitted from the luminescent layer 23 is transmitted through the substrate and then emitted. In this configuration, for example, the second electrode 22 is composed of a light-reflecting conductive material, and the first electrode 21 is composed of a light-transmitting conductive material. In this case, the light emitted from the luminescent layer 23 toward the substrate 10 and the light emitted from the luminescent layer toward the side opposite to the substrate 10 and then reflected by the surface of the second electrode 22 are transmitted through the first electrode 21 and the substrate 10 and then emitted.

<C-3: Modified Example 3>

In the first and second embodiments, each of the power lines 15 does not overlap the selection transistor Tsl and the initialization transistor Tint. However, each of the power lines 15 may be disposed to overlap the selection transistor Tsl or the initialization transistor Tint.

<C-4: Modified Example 4>

In the second embodiment, the connecting portion 62 is formed in the space between the first gate electrode 111 and the second gate electrode 112 of the selection transistor Tsl. Similarly, the second portion 152 of each power line 15 may be formed in the space between the first gate electrode 121 and the second gate electrode 122 of the initialization transistor Tint.

<C-5: Modified Example 5>

In the first embodiment, each of the power lines 15 includes only the portion (the first portion in the invention) extending in the X direction. However, like in the second embodiment, each of the power lines 15 may include the portion (referred to as a "second portion" hereinafter) extending in the Y direction for connecting the respective first portions. For example, the second portion extends in the Y direction in the space between the connecting portion 61 and the electrical continuity portion 71 shown in FIG. 7 and in the space between the adjacent unit elements P to connect together the adjacent power lines (first portions) in the Y direction. In this configuration, the resistance of the power lines 15 can be decreased, as compared with the first embodiment.

<C-6: Modified Example 6>

In each of the above-described embodiments, the luminescent layer 23 is formed only in the region inside the inner edges of the partitions 25. However, the luminescent layer 23 may be continuously formed over the entire surface (in detail, the entire surface of the second insulating layer L2) of the substrate 10. In this case, there is the advantage that the luminescent layer 23 can be formed by a low-cost film deposition technique such as a spin coating method. Although the luminescent layer 23 is continuously formed over a plurality of light-emitting elements E, the quantity of light of the luminescent layer 23 is controlled for each of the light-emitting elements E because the first electrode 21 is formed for each of the light-emitting elements E. As described above, when the luminescent layer 23 is formed over a plurality of light-emitting elements E, the partitions 25 may be omitted.

When the luminescent layer 23 is formed by an ink-jet method (droplet discharge method) of discharging droplets of a luminescent material into each of the spaces divided by the partitions 25, like in each of the above embodiments, the partitions 25 are preferably disposed on the surface of the second insulating layer L2. However, the method for forming the luminescent layer 23 for each of the light-emitting elements E may be appropriately changed. More specifically, the luminescent layer 23 may be formed for each of the light-emitting elements E by any one of various patterning methods, such as a method of selectively removing a luminescent material film formed over the entire surface of the substrate 10 and a laser transfer (LITI: Laser-Induced Thermal Imaging) method. In this case, the luminescent layer 23 can be independently formed for each of the light-emitting elements E without forming the partitions 25. As described above, the partitions 25 are not necessarily provided in the light-emitting device according to any one of the embodiments of the invention.

<C-7: Modified Example 7>

Although, in each of the above embodiments, each light-emitting element E includes the luminescent layer 23 composed of an organic EL material, the light-emitting element is not limited to this. For example, various light-emitting elements such as a light-emitting element including a luminescent layer composed of an inorganic EL, material, a LED (Light Emitting Diode) element, and the like may be used. Any specific structure and materials may be used for the light-emitting element as long as the light-emitting element emits light by the supply of electric energy (typically, the supply of a current).

<D: Application Examples>

Figure 27:
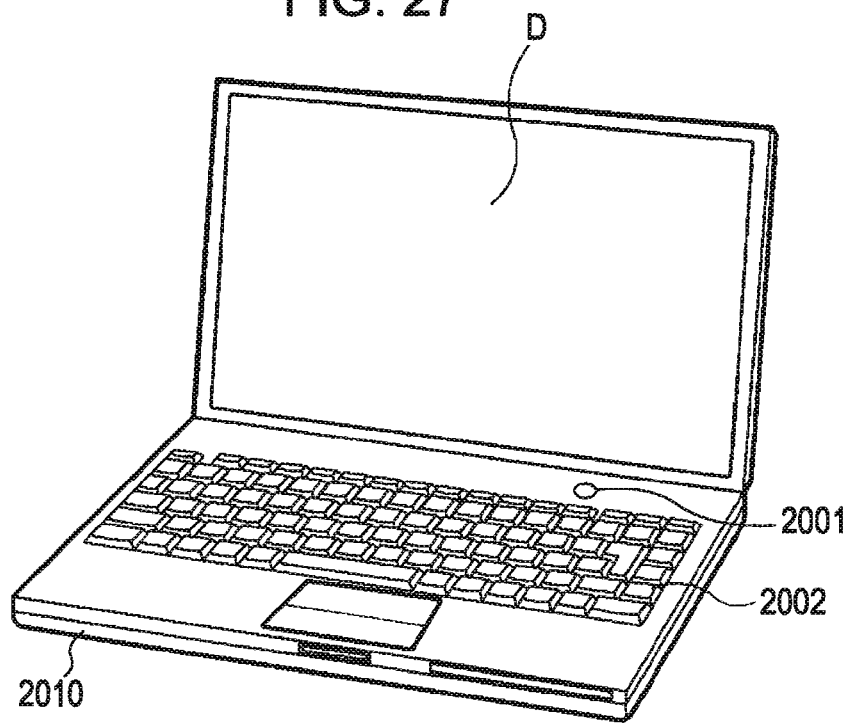
FIG. 27 is a perspective view showing a personal computer as an example of electronic apparatuses according to an embodiment of the invention.

Next, specific examples of an electronic apparatus using the light-emitting device according to any one of the embodiments of the invention will be described below. FIG. 27 is a perspective view showing the configuration of a mobile personal computer using the light-emitting device D according to any one of the embodiments as a display. A personal computer 2000 includes the light-emitting device D serving as a display and a body part 2010. The body part 2010 is provided with a power switch 2001 and a keyboard 2002. Since the light-emitting device D includes the light-emitting element E using the luminescent layer 23 composed of an organic EL material, the light-emitting device D has a wide angel of view and an easy-to-see display screen.

Figure 28:
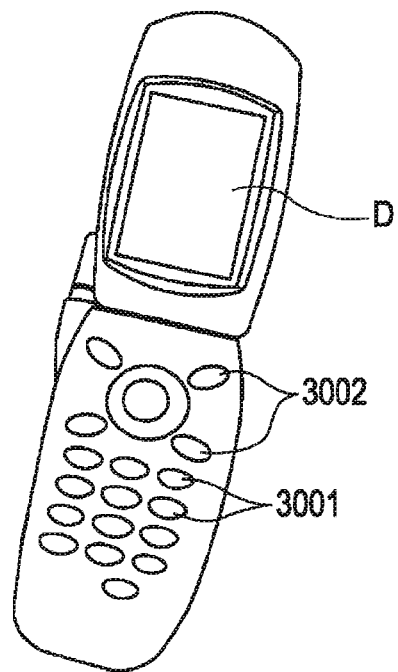
FIG. 28 is a perspective view showing a cellular phone as an example of electronic apparatuses according to an embodiment of the invention.

FIG. 28 shows the configuration of a cellular phone including the light-emitting device D according to any one of the embodiments. A cellular phone 3000 is provided with a plurality of operation buttons 3001, scroll buttons 3002, and the light-emitting device D serving as a display. A screen displayed on the light-emitting device E is scrolled by operating the scroll buttons 3002.

Figure 29:
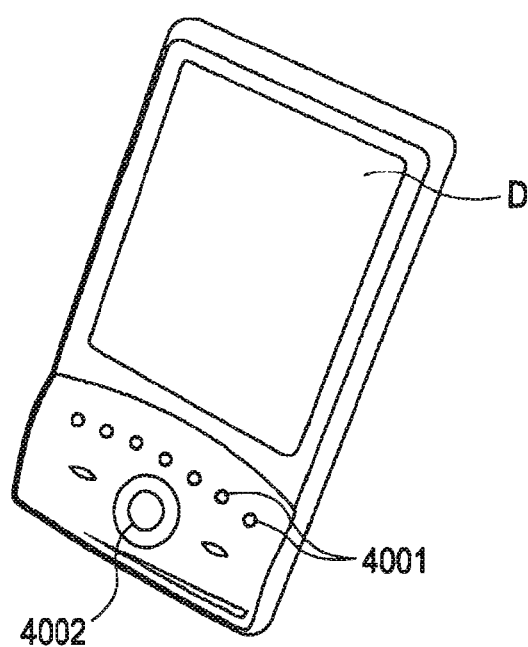
FIG. 29 is a perspective view showing a handheld terminal as an example of electronic apparatuses according to an embodiment of the invention.

FIG. 29 shows the configuration of a handheld terminal (PDA: Personal Digital Assistants) including the light-emitting device D according to any one of the embodiments. A handheld terminal 4000 is provided with a plurality of operation buttons 4001, a power switch 4002, and the light-emitting device D serving as a display. By operating the power switch 4002, various types of information such as an address list, a schedule book, and the like are displayed on the light-emitting device D.

Besides the apparatuses shown in FIGS. 27 to 29, examples of an electronic apparatus including the light-emitting device according to any one of the embodiments of the invention include apparatuses including a digital still camera, a television, a video camera, a car navigation system, a pager, an electronic notebook, an electronic paper, an electronic calculator, a word processor, a work station, a picture phone, a POS terminal, a printer, a scanner, a copying machine, a video player, and a touch panel. The application of the light-emitting device is not limited to image display. For example, in an image forming apparatus such as an optical writing-type printer or electronic copying machine, the light-emitting device may be used as a write head in which a photosensitive material is exposed according to an image to be formed on a recording material such as paper or the like.

What is claimed is:

1. A light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in the first direction, the gate electrode which overlaps the channel region in plan view being positioned between the electrical continuity portion and the capacitor element in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

2. The light-emitting device as set forth in claim 1, a gate insulating layer being disposed between the channel region and the gate electrode, the capacitor element including a third electrode electrically connected to the gate electrode, a fourth electrode facing the third electrode, and a first insulating layer disposed between the third and fourth electrodes, the first insulating layer covering the gate electrode and the third electrode, and the electrical continuity portion being formed above the first insulating layer.

3. The light-emitting device as set forth in claim 2, the third electrode and the gate electrode being formed in a first layer.

4. The light-emitting device as set forth in claim 3, the semiconductor layer and the fourth electrode being formed in a second layer.

5. The light-emitting device as set forth in claim 1, further comprising:

a selection transistor that is placed in an on state or an off state in response to a selection signal, the gate electrode of the first transistor being set at a potential according to a data signal that is supplied from a data line through the selection transistor that has been placed in the on state, and the capacitor element being positioned between the selection transistor and the first transistor in plan view.

6. The light-emitting device as set forth in claim 1, further comprising:

a second transistor that is electrically connected between the gate electrode of the first transistor and a drain of the first transistor, and the capacitor element being positioned between the first transistor and the second transistor in plan view.

7. The light-emitting device as set forth in claim 6, a selection transistor being positioned between the capacitor element and the second transistor in plan view, a connecting portion being electrically connected to the second transistor and the gate electrode of the first transistor, and the gate electrode of the selection transistor and the connecting portion not having an overlapping portion in plan view.

8. The light-emitting device as set forth in claim 7, the selection transistor including first and second gate electrodes, and the connecting portion being positioned between the first and second gate electrodes.

9. The light-emitting device as set forth in claim 1, the capacitor element including a third electrode electrically connected to the gate electrode of the first transistor and a fourth electrode opposed to the third electrode, the third electrode and the gate electrode being disposed in a first layer.

10. A light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in a direction intersecting the first direction, the electrical continuity portion being positioned on one side with respect to the gate electrode which overlaps the channel region in plan view, the capacitor element being positioned on another side with respect to the gate electrode which overlaps the channel region in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

11. The light-emitting device as set forth in claim 10, a gate insulating layer being disposed between the channel region and the gate electrode, the capacitor element including a third electrode electrically connected to the gate electrode, a fourth electrode facing the third electrode, and a first insulating layer disposed between the third and fourth electrodes, the first insulating layer covering the gate electrode and the third electrode, and the electrical continuity portion being formed above the first insulating layer.

12. The light-emitting device as set forth in claim 11, the third electrode and the gate electrode being formed in a first layer.

13. The light-emitting device as set forth in claim 12, the semiconductor layer and the fourth electrode being formed in a second layer.

14. The light-emitting device as set forth in claim 10, further comprising:

a selection transistor that is placed in an on state or an off state in response to a selection signal, the gate electrode of the first transistor being set at a potential according to a data signal that is supplied from a data line through the selection transistor that has been placed in the on state, and the capacitor element being positioned between the selection transistor and the first transistor in plan view.

15. The light-emitting device as set forth in claim 10, further comprising:

a second transistor that is electrically connected between the gate electrode of the first transistor and a drain of the first transistor, and the capacitor element being positioned between the first transistor and the second transistor in plan view.

16. The light-emitting device as set forth in claim 15, a selection transistor being positioned between the capacitor element and the second transistor in plan view, a connecting portion being electrically connected to the second transistor and the gate electrode of the first transistor, and the gate electrode of the selection transistor and the connecting portion not having an overlapping portion in plan view.

17. The light-emitting device as set forth in claim 16, the selection transistor including first and second gate electrodes, and the connecting portion being positioned between the first and second gate electrodes.

18. The light-emitting device as set forth in claim 10, the capacitor element including a third electrode electrically connected to the gate electrode of the first transistor and a fourth electrode opposed to the third electrode, the third electrode and the gate electrode being disposed in a first layer.

19. An electronic device, comprising:

a light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in the first direction, the gate electrode which overlaps the channel region being positioned between the electrical continuity portion and the capacitor element in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

20. An electronic device, comprising:

a light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in the first direction, the electrical continuity portion being positioned on one side with respect to the gate electrode which overlaps the channel region in plan view, the capacitor element being positioned on another side with respect to the gate electrode which overlaps the channel region in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

21. A light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in a direction intersecting the first direction, the gate electrode which overlaps the channel region in plan view being positioned between the electrical continuity portion and the capacitor element in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

22. A light-emitting device, comprising: above a substrate, a first transistor including a semiconductor layer which has a channel region and a gate electrode which overlaps the channel region in plan view, the first transistor electrically connected between a light-emitting element and a power source line, a capacitor element electrically connected to the gate electrode of the first transistor, and an electrical continuity portion electrically connected to the first transistor and the light-emitting element, the power source line overlapping the capacitor element in plan view, and being extended in a first direction, in a direction intersecting the first direction, the electrical continuity portion being positioned on one side with respect to the gate electrode which overlaps the channel region in plan view, the capacitor element being positioned on another side with respect to the gate electrode which overlaps the channel region in plan view, the light-emitting element having a first electrode electrically connected to the electrical continuity portion, and the first electrode having a portion overlapping at least one of the first transistor and the capacitor element in plan view, and the portion overlapping the power source line and the capacitor element in plan view.

\* \* \* \* \*